US010886888B2

(12) United States Patent
Ivira et al.

(10) Patent No.: US 10,886,888 B2
(45) Date of Patent: Jan. 5, 2021

(54) BULK ACOUSTIC WAVE RESONATOR HAVING OPENINGS IN AN ACTIVE AREA AND A PILLAR BENEATH THE OPENING

(71) Applicant: Avago Technologies International Sales Pte. Limited, Singapore (SG)

(72) Inventors: Brice Ivira, San Jose, CA (US); Chris Kirkendall, Hollister, CA (US); Pen Li Yu, San Jose, CA (US); Sormeh Setoodeh, San Jose, CA (US); David Albert Feld, Los Altos, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 0 days.

(21) Appl. No.: 16/521,640

(22) Filed: Jul. 25, 2019

(65) Prior Publication Data

US 2019/0348963 A1 Nov. 14, 2019

Related U.S. Application Data

(63) Continuation-in-part of application No. 16/281,359, filed on Feb. 21, 2019, which is a continuation of application No. 15/336,277, filed on Oct. 27, 2016, now Pat. No. 10,284,168.

(51) Int. Cl.
*H03H 9/02* (2006.01)
*H03H 9/17* (2006.01)
*H03H 9/13* (2006.01)
*H03H 9/60* (2006.01)
*H03H 9/58* (2006.01)

(52) U.S. Cl.
CPC .... *H03H 9/02086* (2013.01); *H03H 9/02118* (2013.01); *H03H 9/132* (2013.01); *H03H 9/173* (2013.01); *H03H 9/175* (2013.01); *H03H 9/587* (2013.01); *H03H 9/589* (2013.01); *H03H 9/605* (2013.01)

(58) Field of Classification Search
CPC .. H03H 9/54; H03H 9/56; H03H 9/02; H03H 9/13; H03H 9/17
See application file for complete search history.

(56) References Cited

U.S. PATENT DOCUMENTS

| 5,587,620 | A | 12/1996 | Ruby |
| 5,873,153 | A | 2/1999 | Ruby |
| 5,910,756 | A | 6/1999 | Ella |
| 6,107,721 | A | 8/2000 | Lakin |
| 6,215,375 | B1 | 4/2001 | Larson et al. |
| 6,262,637 | B1 | 7/2001 | Bradley |

(Continued)

*Primary Examiner* — Dean O Takaoka
*Assistant Examiner* — Alan Wong
(74) *Attorney, Agent, or Firm* — Foley & Lardner LLP

(57) ABSTRACT

A bulk acoustic wave (BAW) resonator is disclosed. The BAW resonator includes: a lower electrode; a piezoelectric layer disposed over the lower electrode; and an upper electrode over the piezoelectric layer. An opening having a first area exists in and extends completely through the upper electrode. The BAW resonator also includes a substrate disposed below the lower electrode; a cavity; and a pillar disposed in the cavity and extending to contact a portion of the lower electrode disposed beneath the opening. The pillar has a second area that is less than the first area. There are no electrical connections that extend across the opening from one side to another.

20 Claims, 16 Drawing Sheets

(56) References Cited

U.S. PATENT DOCUMENTS

| | | | |
|---|---|---|---|
| 6,507,983 B1 | 1/2003 | Ruby et al. | |
| 6,714,102 B2 | 3/2004 | Ruby et al. | |
| 6,828,713 B2 | 12/2004 | Bradley | |
| 7,212,082 B2 | 5/2007 | Nagao et al. | |
| 7,280,007 B2 | 10/2007 | Feng | |
| 7,321,183 B2 * | 1/2008 | Ebuchi | H03H 3/02 |
| | | | 310/324 |
| 7,332,985 B2 | 2/2008 | Larson, III et al. | |
| 7,345,410 B2 | 3/2008 | Grannen et al. | |
| 7,358,831 B2 | 4/2008 | Larson | |
| 7,369,013 B2 | 5/2008 | Fazzio | |
| 7,388,454 B2 | 6/2008 | Ruby et al. | |
| 7,561,009 B2 | 7/2009 | Larson et al. | |
| 7,629,865 B2 | 12/2009 | Ruby et al. | |
| 7,714,684 B2 | 5/2010 | Ruby et al. | |
| 7,791,434 B2 | 9/2010 | Fazzio | |
| 7,889,027 B2 | 2/2011 | Oka et al. | |
| 7,986,075 B2 * | 7/2011 | Asai | H03H 3/02 |
| | | | 310/320 |
| 8,188,810 B2 | 5/2012 | Feng | |
| 8,230,562 B2 | 7/2012 | Fazzio | |
| 8,248,185 B2 | 8/2012 | Choy | |
| 8,436,516 B2 | 5/2013 | Ruby et al. | |
| 8,854,156 B2 * | 10/2014 | Iwashita | H03H 9/02133 |
| | | | 333/187 |
| 8,902,023 B2 | 12/2014 | Choy | |
| 9,197,185 B2 | 11/2015 | Zou | |
| 9,243,316 B2 | 1/2016 | Larson | |
| 9,444,428 B2 * | 9/2016 | Ruby | H03H 9/02102 |
| 9,450,167 B2 | 9/2016 | Zou et al. | |
| 9,455,681 B2 | 9/2016 | Feng et al. | |
| 9,590,165 B2 | 3/2017 | Zou et al. | |
| 9,602,073 B2 | 3/2017 | Grannen et al. | |
| 9,608,589 B2 | 3/2017 | Grannen et al. | |
| 9,679,765 B2 | 6/2017 | Larson, III et al. | |
| 9,847,768 B2 | 12/2017 | Grannen et al. | |
| 9,853,626 B2 | 12/2017 | Burak et al. | |
| 10,177,736 B2 | 1/2019 | Ivira et al. | |
| 10,284,168 B2 | 5/2019 | Ivira et al. | |
| 10,601,391 B2 * | 3/2020 | Stokes | H03H 9/02086 |
| 2007/0205850 A1 | 9/2007 | Jamneala | |
| 2011/0180391 A1 | 7/2011 | Larson et al. | |
| 2011/0266925 A1 | 11/2011 | Ruby | |
| 2012/0177816 A1 | 7/2012 | Larson | |
| 2012/0326807 A1 | 12/2012 | Choy et al. | |
| 2013/0015747 A1 | 1/2013 | Ruby | |
| 2013/0049545 A1 | 2/2013 | Zou | |
| 2013/0049888 A1 | 2/2013 | Ruby | |
| 2013/0147577 A1 | 6/2013 | Nishihara et al. | |
| 2014/0118090 A1 | 5/2014 | Grannen | |
| 2014/0132117 A1 | 5/2014 | Larson | |
| 2014/0175950 A1 | 6/2014 | Zou | |
| 2014/0225682 A1 | 8/2014 | Burak | |
| 2014/0292150 A1 | 10/2014 | Zou | |
| 2014/0354109 A1 | 12/2014 | Grannen | |
| 2015/0207489 A1 | 7/2015 | Bi | |
| 2015/0244347 A1 | 8/2015 | Feng | |
| 2015/0280687 A1 | 10/2015 | Burak et al. | |
| 2015/0311046 A1 | 10/2015 | Yeh | |
| 2018/0138885 A1 | 5/2018 | Stokes et al. | |

* cited by examiner

US 10,886,888 B2

BULK ACOUSTIC WAVE RESONATOR HAVING OPENINGS IN AN ACTIVE AREA AND A PILLAR BENEATH THE OPENING

CROSS REFERENCE TO RELATED APPLICATION

The present application is a continuation-in-part under 37 C.F.R. § 1.53(b) of commonly owned U.S. patent application Ser. No. 16/281,359, entitled "Bulk Acoustic Wave Resonator" filed on Feb. 21, 2019, which is a continuation under 37 C.F.R. § 1.53(b) of commonly owned U.S. patent application Ser. No. 15/336,277, entitled "Bulk Acoustic Wave Resonator" filed on Oct. 27, 2016. Priority is claimed under 35 U.S.C. § 130 to U.S. patent application Ser. No. 16/281,359 and under 35 U.S.C. § 130 to U.S. patent application Ser. No. 15/336,277. The entire disclosures of U.S. patent application Ser. No. 16/281,359 and U.S. patent application Ser. No. 15/336,277 are specifically incorporated by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a duplexer (diplexer, triplexer, quadplexer, quintplexer, notch filters, etc.) for example, connected between an antenna and a transceiver for filtering received and transmitted signals.

Various types of filters use mechanical resonators, such as bulk acoustic wave (BAW) resonators, including film bulk acoustic resonators (FBARs) and solidly mounted resonators (SMRs), or surface acoustic wave (SAW) resonators. The resonators convert electrical signals to mechanical signals or vibrations, and/or mechanical signals or vibrations to electrical signals. A BAW resonator, for example, is an acoustic device comprising a stack that generally includes a layer of piezoelectric material between two electrodes. Acoustic waves achieve resonance across the acoustic stack, with the resonant frequency of the waves being determined by the materials in the acoustic stack and the thickness of each layer (e.g., piezoelectric layer and electrode layers). One type of BAW resonator includes a piezoelectric film as the piezoelectric material, which may be referred to as an FBAR as noted above. FBARs resonate at GHz frequencies, and are thus relatively compact, having thicknesses on the order of microns and length and width dimensions of hundreds of microns.

Among other uses, acoustic resonators may be used as notch filters or band-pass filters with associated passbands providing ranges of frequencies permitted to pass through the filters. With increasing power requirements placed on devices (e.g., mobile phones), ever increasing power demands are placed on filters, and particularly the resonators of the filters. These increasing power demands can have adverse impacts on the performance and reliability of the resonators. For example, as radio frequency (RF) signals with greater electrical power are applied to known RF resonators, excessive self-heating can occur near the geometric center of the active acoustic stack, which is the farthest from the points where the active acoustic stack contacts the substrate (so-called anchor points or thermal ground where power is dissipated). As can be appreciated, the size and shape of the hot spot depends on the frequency and power applied and absorbed, as well as the thermal resistance.

The temperature gradient in the hot spot creates an active area divided into multiple resonators resonating at different frequencies, and with different acoustic properties. This temperature gradient also impacts the physical properties of the material (e.g., material stiffness, dielectric permittivity, piezoelectric coefficients), and creates acoustic discontinuities in the active acoustic stack. These acoustic discontinuities in the region of the hot spot results in further energy confinement, which is manifest in further heating at the hot spot.

What is needed, therefore, is a BAW resonator that overcomes at least the shortcomings of known BAW resonators described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

DETAILED DESCRIPTION

Figure 1A:
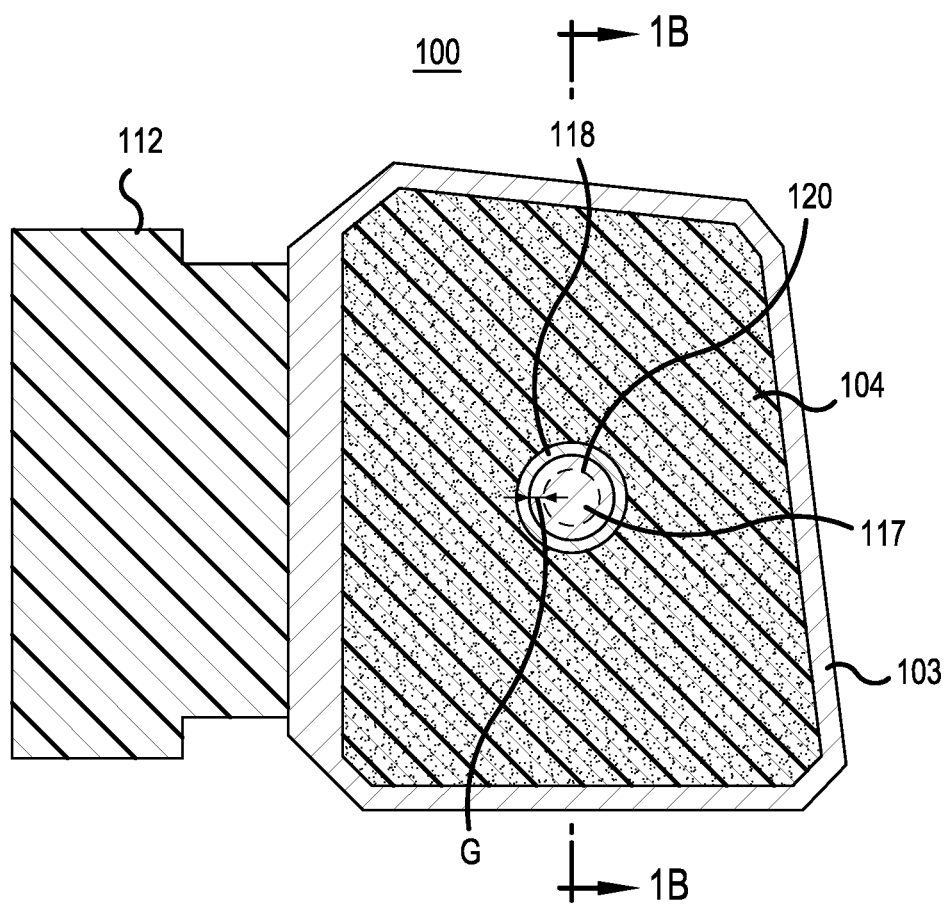
FIG. 1A is a top view of a bulk acoustic wave (BAW) resonator in accordance with a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

As used herein, a 'comparable BAW resonator' is an identical BAW resonator but without an opening and/or a pillar of the present teachings.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, a bulk acoustic wave (BAW) resonator comprises: a lower electrode; a piezoelectric layer disposed over the lower electrode; an upper electrode disposed over the piezoelectric layer, wherein an opening having a first area exists in and extends completely through the upper electrode; a substrate disposed below the lower electrode; a cavity; and a pillar disposed in the cavity and extending to contact a portion of the lower electrode located beneath the opening. The pillar has a second area that is less than the first area, wherein there are no electrical connections that extend across the opening from one side to another.

In accordance with another representative embodiment, a bulk acoustic wave (BAW) resonator comprises: a lower electrode; a piezoelectric layer disposed over the lower electrode; an upper electrode disposed over the piezoelectric layer, wherein an opening having a first area exists in and extends completely through the upper electrode; a substrate disposed below the lower electrode; a cavity; and a plurality of openings, and a plurality of pillars. At least one of the plurality of pillars is disposed beneath a corresponding one of the plurality of openings, and contacts a portion of the lower electrode located beneath the opening. No electrical connections extend across the opening from one side to another.

When connected in a selected topology, a plurality of the resonators can act as an electrical filter. For example, the acoustic resonators may be arranged in a ladder-filter or lattice-filter arrangement, such as described in U.S. Pat. No. 5,910,756 to Ella, and U.S. Pat. No. 6,262,637 to Bradley, et al., the disclosures of which are specifically incorporated herein by reference. The electrical filters may be used in a number of applications, such as in duplexers (diplexers, triplexers, quadplexers, quintplexers, etc.).

A variety of devices, structures thereof, materials and methods of fabrication are contemplated for the BAW resonators of the apparatuses of the present teachings. Various details of such devices and corresponding methods of fabrication may be found, for example, in one or more of the following U.S. patent publications: U.S. Pat. No. 6,107,721, to Lakin; U.S. Pat. Nos. 5,587,620, 5,873,153, 6,507,983, 7,388,454, 7,714,684, and 8,436,516 to Ruby et al.; U.S. Pat. Nos. 7,369,013, 7,791,434, and 8,230,562 to Fazzio, et al.; U.S. Pat. Nos. 8,188,810, and 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009, 7,358,831, 8,673, 121, 9,243,316 to Larson, III et al.; U.S. Pat. No. 9,197,185 to Zou, et al., U.S. Patent Application Publication No. 20120326807 to Choy, et al.; U.S. Pat. No. 7,629,865 to Ruby; U.S. Pat. Nos. 9,243,316 and 9,679,765 to Larson III; U.S. Patent Application Publication No. 20070205850 to Jamneala et al.; U.S. Patent Application Publication No. 20130015747 to Ruby, et al.; U.S. Pat. No. 9,197,185 to Zou, et al.; U.S. Patent Application Publication No. 20140225682 to Burak, et al.; U.S. Pat. Nos. 9,579,596 and 9,602,073 to Grannen, et al.; U.S. Pat. Nos. 9,450,167 and 9,590,165 to Zou, et al.; U.S. Pat. No. 9,455,681 to Feng, et al.; U.S. Patent Application Publication No. 20150311046 to Yeh, et al.; U.S. Patent Application Publication No. 20150207489 to Bi, et al.; and U.S. Pat. No. 10,177,736, to Ivira, et al. The entire disclosure of each of the patents, and patent application publications listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

In certain alternative embodiments of the present teachings, when the cavity is filled, the acoustic reflector comprises alternating layers of high acoustic impedance material and low acoustic impedance materials formed in or on the substrate. Illustratively, this type of acoustic reflector is often referred to as an acoustic Bragg reflector such as described in U.S. Pat. No. 6,107,721 to Lakin, or as described in commonly owned U.S. Pat. No. 7,332,985 to Larson, et al., or as described in commonly owned U.S. Pat. No. 7,358,831 to Larson. The disclosures of U.S. Pat. Nos. 6,107,721, 7,332,985 and 7,358,831 are specifically incorporated into the present disclosure by reference in their entirety. FIG. 1A is a top view of a bulk acoustic wave (BAW) resonator 100 in accordance with a representative embodiment.

The BAW resonator 100 comprises a lower electrode (not shown in FIG. 1A) disposed over a substrate (not shown in FIG. 1A), and an upper electrode 104 disposed over a piezoelectric layer 103. A passivation layer (not shown in FIG. 1A) may be optionally provided over the upper electrode, as may other components (not shown in FIG. 1A), such as mass loading layers that are useful for tuning the frequency of the BAW resonator 100.

The BAW resonator 100 comprises an interconnect 112 for providing a signal input or signal output to the upper electrode 104. A bridge (not shown in FIG. 1A) may be optionally provided between the upper electrode 104 and the interconnect 112; and cantilevered portions (not shown in FIG. 1A) may be optionally provided over one or more of the sides of the upper electrode 104, excepting the side of the interconnect 112.

As depicted more clearly below, the region of contacting overlap of the lower electrode (not shown in FIG. 1A), upper electrode 104, the piezoelectric layer 103 and a cavity (not shown in FIG. 1A) is referred to as an active area of the BAW resonator 100. When an electrical signal is applied to the BAW resonator 100, the acoustic motion of particles is launched and propagated in this area. This acoustic motion contributes to the self-heating of the BAW resonator 100 described below. By contrast, an inactive area of the BAW resonator 100 comprises a region of overlap between lower electrode (not shown in FIG. 1A), or upper electrode 104, or both, and the piezoelectric layer 103 that is not disposed over the cavity. An opening 117 is provided in the upper electrode 104. As described more fully below, the opening 117 is not made in layers beneath the upper electrode (e.g., the piezoelectric layer 103, or the lower electrode (not shown in FIG. 1A)). Notably, no electrical connections extend from one side of the opening 117 to another.

A pillar 120 is disposed beneath the opening 117. As described more fully below, in addition to providing mechanical stability to the membrane of the BAW resonator 100, the pillar 120 provides a thermal sink, which beneficially dissipates heat from the region of the opening 117. As shown in FIG. 1A and other embodiments in this disclosure, the pillar 120 comprises an elongated structure disposed within the BAW resonator 100, but distanced away from a boundary of the BAW resonator 100. The pillar 120 may be referred to as an elongated thermal structure. The pillar 120 extends in a longitudinal direction thermally connecting the substrate and the lower electrode. A cross sectional view of the pillar 120 taken at a direction perpendicular to the longitudinal direction of the elongated structure may comprise a circular shape (and thus a circular cross-section) as shown in FIG. 1A; however in other embodiments, the cross sectional view of the pillar 120 may be elliptical, square, pentagonal, hexagonal or any other irregular shape. When the cross sectional view of the pillar 120 is not a circular shape, a diameter of the pillar 120 is the maximum dimension measurable in a direction orthogonal to the longitudinal axis of the pillar 120 (cross-sectional dimension). For example, when the cross sectional view of the pillar 120 has an elliptical shape (and thus an elliptical cross-section), the diameter of the pillar 120 shall be the major axis, taken from one side of the elliptical shape through the center to the other side, at the widest part of the elliptical shape. As shown in FIG. 1A and other embodiments in the specification, the cross sectional view of the pillar 120 may be co-axially aligned with the opening 117. As described more fully herein, a gap 'G' exists as shown. In another embodiment where the gap 'G' is extremely small, the pillar 120 may be substantially aligned with the opening 117 such that the gap 'G' may be close to zero. Generally, the pillar 120 has a cross-sectional shape that is substantially the same as the shape of the opening 117. In accordance with representative embodiments described herein, the pillar 120 has a cross-sectional area in the range of approximately 3.0 $\mu m^2$ to approximately $1.25 \times 10^5$ $\mu m^2$. The cross-sectional area may be approximately less than 30% of the active area of the BAW resonator 100.

As shown in FIG. 1A and other subsequent embodiments, the pillar 120 may comprise a pillar material that is substantially the same as a material of the substrate (not shown in FIG. 1A). Alternatively, the pillar 120 may comprise a material that is dissimilar to the substrate. For example, the pillar 120 may comprise a pillar material that has higher heat conductivity as compared to the material of the substrate. One example of such pillar material may be copper and, an example of the substrate material may be silicon. Alternatively, the pillar 120 may comprise more than one pillar material. For example, the pillar 120 may comprise a pillar stack of a first material stacked on a second material. For example the pillar stack may comprise a metallic material stacked over a silicon material or vice versa. In the embodiment shown in FIG. 1A, the pillar 120 optionally comprises a material that has substantially the same coefficient of thermal expansion (CTE) as the substrate. In other embodiments where the pillar 120 has a dissimilar material, the CTE of the pillar material and the substrate material differs in a range such that delamination can be prevented. In other words, other than heat dissipation, the pillar material may be selected considering factors which may affect the reliability of the BAW resonator 100 such as CTE mismatch.

Without the opening 117 or the pillar 120, when an electrical signal is applied to the BAW resonator 100, the area approximating the opening 117 would observe an unacceptable amount of self-heating as observed in a comparable BAW resonator. More generally, and as will become clearer as the present description continues, the opening 117 has an inner perimeter, and the BAW resonator 100 has an outer perimeter. The inner perimeter bounds the opening 117, which is not a portion of the active area of the BAW resonator 100, and in this and other representative embodiments there are normally frame elements (e.g., cantilevered portions) along the inner perimeter. The outer perimeter defines the interface between the active area of BAW resonator 100, and the non-active/dead portion of the BAW resonator 100 outside the cavity (not shown in FIG. 1A). By the present teachings, the opening 117 is located away (preferably farther away) from the outer perimeter. By providing a separation (preferably the largest separation) between the inner perimeter and the outer perimeter, the magnitude of undesirable spurious modes (rattles) decreases. The thermal resistance of the BAW resonator 100 will decrease as the total perimeter (inner and outer) of the BAW resonator 100 increases. The shape of the BAW resonator 100 as well as the connection configuration may dictate the best placement of the pillar 120 to minimize electrical current crowding, while the resistance of the resonator at the parallel resonance frequency (Rp) is beneficially maintained at as large as possible.

Of note, in accordance with the present teachings, there are no electrical connections that extend from one side of the opening 117 to another. This is also applicable in embodiments described below, which comprise a plurality of openings 117 in the BAW resonator 100.

As described more fully below, frame elements, which are shown generally at 118 are optionally provided along the perimeter of the opening 117, and therefore form a portion of the perimeter of the active area of the BAW resonator 100. As noted below, a frame element as referred to in the representative embodiment of FIG. 1A and all subsequent embodiments, may include at least one or all of a recessed frame element (sometimes referred to as an "innie"), a raised frame element (sometimes referred to as an "outie"), a cantilevered portion (sometimes referred to as a "wing"), or other structures located at the perimeter of the opening 117 that is distinguishable from an inner portion of the active area of the BAW resonator 100. Provision of frame elements has the benefit of reducing acoustic energy loss, and therefore improving the quality-factor (Q) of the BAW resonator 100. However, as will become clearer as the present description continues, reflections of acoustic waves at the frame elements provided along the perimeter of the opening 117 also reduce the likelihood of energy loss through the pillar 120 as described below.

The BAW resonator 100 may optionally comprise a bridge (not shown) along the interconnect 112. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 100.

As described below in connection with various representative embodiments, the opening 117 is located in a region of the BAW resonator 100 that is otherwise susceptible to unacceptable levels of overheating caused by self-heating as observed in a comparable BAW resonator without the opening 117 or the pillar 120. This region is often comparatively far from a thermal ground, or anchor point, which is a portion of the inactive area that contacts the substrate. Notably, the shape of the opening 117 is chosen to somewhat match the shape of the region. Illustratively, the opening 117 has a substantially circular shape, as shown. However, this is not essential, and other shapes are contemplated.

Because the thermal resistance is greater from the geometric center of a comparable BAW resonator to the edge (anchor point) of the comparable BAW resonator than it is from points on the comparable BAW resonator closer to the edge (anchor point) of the comparable BAW resonator, the propensity for unacceptable levels of self-heating when subject to an electrical signal is comparatively great in the comparable BAW resonators. As noted above, a comparable BAW resonator is an identical corresponding BAW resonator but without the opening and/or the pillar. By thermal conduction the heat is partially extracted from the active area of the comparable BAW resonator and moved into the substrate, which helps to cool down the active area as air is a comparatively poor thermal conductor, there is no significant heat conduction through the air, and, as such, no heat flows out of the top of the comparable BAW resonator. Similarly since the cavity typically has a poor thermal conductivity, there is little heat that flows out of the bottom of the comparable resonator. In summary, the heat can be extracted from the active area only by flowing out through the anchor points. As such, the distance the heat has to travel from the center of the BAW resonator to the edge is comparatively large, and therefore the thermal resistance is comparatively high. Thus, a thermal gradient is generated in a plane from the geometric center (centroid) of the resonator toward its outer perimeter. As noted, in the comparable BAW resonator, the center or central portion of the active area (membrane when over a cavity), near the centroid of the active area, is hotter than the perimeter of the active area when an electrical signal is applied. In addition, this heating effect potentially induces more non-uniform stresses and strains in the active area, especially for resonators having a larger active area. Ultimately, the comparable BAW resonator may operate at unacceptably high temperatures, which may reduce its electrical performance (mainly manifest in a reduced quality factor (Q) and a reduced electromechanical coupling coefficient ($kt^2$)); reduce its power handling; degrade its insertion loss; and shift the passband of a filter comprising comparable BAW resonators.

In contrast, by removing a portion of the upper electrode 104 of the BAW resonator 100 to provide the opening 117, the BAW resonator 100 does not have an active area at the opening 117. Stated somewhat differently, the region of the active area, which is otherwise susceptible to higher levels of heating as observed in a comparable BAW resonator, is removed in the BAW resonator 100 of the present teachings. As described more fully below, the pillar 120 is disposed in the cavity (not shown in FIG. 1A), and is substantially aligned with the opening 117. Through careful placement of the pillar 120, substantially no electric field exists in the region of the piezoelectric layer 103 below the opening 117, thereby eliminating the ability for the piezoelectric effect to be supported, and thus propagation of acoustic waves in this region. By eliminating the electric field in the region of the piezoelectric layer below the opening, heat and acoustic propagation of the BAW resonator 100 are also both eliminated in this region. As noted above, according to a representative embodiment, the center of the opening 117 is located at substantially the greatest distance from an anchor point of BAW resonator 100 to enhance heat dissipation.

In order to maintain the impedance of the BAW resonator 100 with the region of the opening 117 not contributing to the active area of the device as compared to a comparable BAW resonator, the area of the BAW resonator 100 is increased outside of the region of the opening 117 by an amount substantially equal to the area of the opening 117. As will be appreciated, this additional area will result in an increase in the perimeter of the BAW resonator 100, which is in contact with the substrate. Because the distance from any point on the active area of the BAW resonator 100 to the anchor point is necessarily less by the elimination of the portion of the upper electrode 104 to form the opening 117, the overall thermal resistance of the BAW resonator 100 is lower as compared to a comparable BAW resonator. While points in the active area of the BAW resonator 100 that are farther from the edges (anchor points) experience greater self-heating than those points closer to the edges; because the portion of the BAW resonator 100 that is most susceptible to extreme self-heating has been removed, the magnitude of the thermal resistance and thereby thermal heating of the BAW resonator 100 is reduced as compared to a comparable BAW resonator. Accordingly, the overall thermal profile of the BAW resonator 100 is beneficially reduced. This reduction in self-heating enables application of RF signals to the BAW resonator 100 having greater electrical power. As can be appreciated, this improves the overall performance and reliability of the BAW resonator 100 compared to comparable BAW resonators. Specifically, when compared to a comparable BAW resonator, BAW resonator 100, has an improved Q, an improved acoustic coupling coefficient ($kt^2$), improved power handling and less degradation of insertion loss; moreover, there is less, if any, shift in the passband of a filter comprising one or more BAW resonators of the present teachings when compared with a filter comprising only comparable BAW resonators.

Figure 1B:
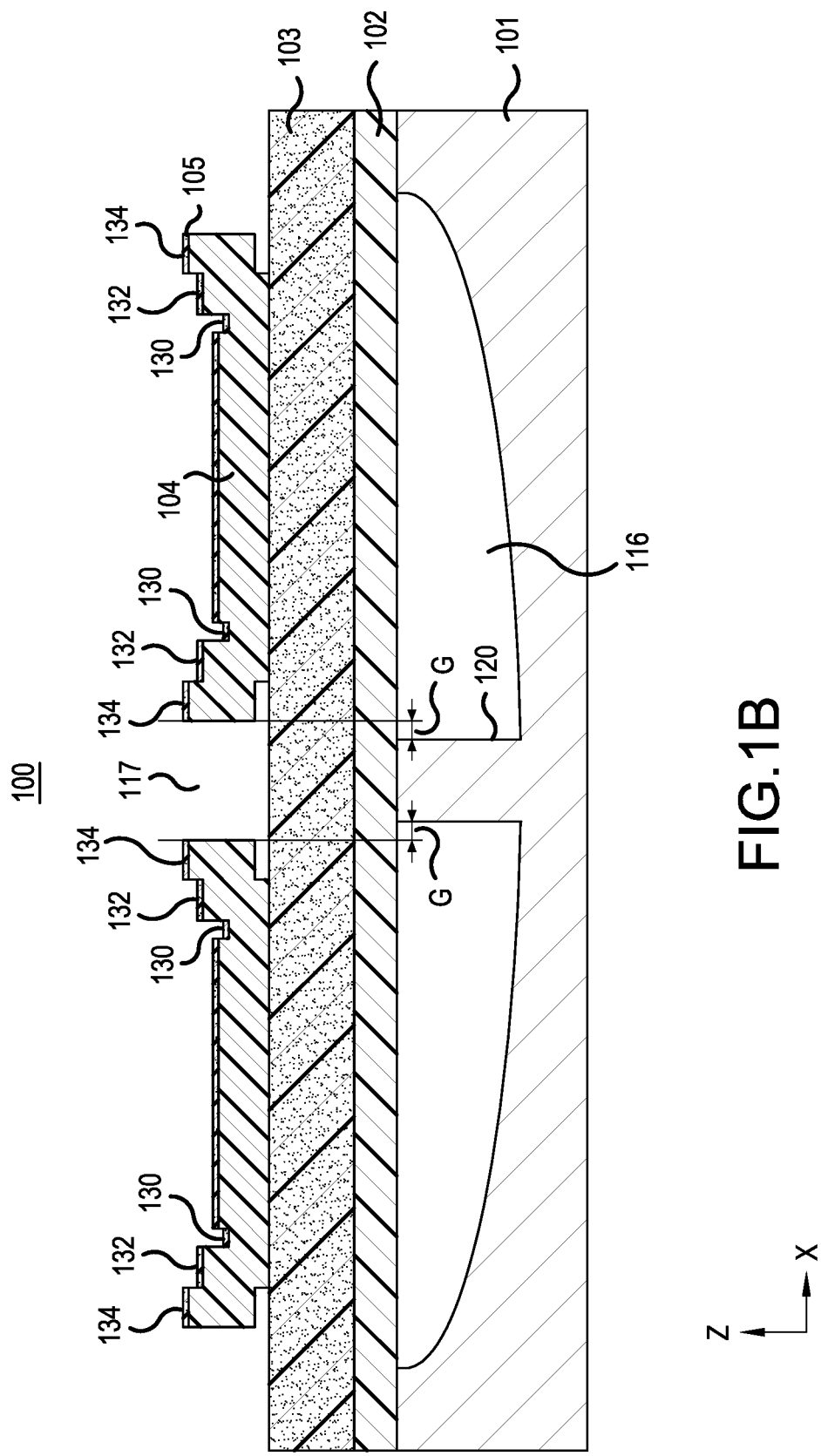
FIG. 1B is a cross-sectional view of a BAW resonator taken along line 1B-1B in FIG. 1A in accordance with a representative embodiment.

FIG. 1B depicts a cross-sectional view of BAW resonator 100 of FIG. 1A along the line 1B-1B. As can be appreciated, the BAW resonator 100 comprises an FBAR.

The BAW resonator 100 comprises a substrate 101, a cavity 116, a lower electrode 102 disposed beneath a piezoelectric layer 103, and an upper electrode 104 disposed thereover.

As shown in FIG. 1B and other embodiments throughout this disclosure, the lower electrode 102 may be disposed over the cavity 116. The cavity 116 may be filled with air or another material that enables the cavity 116 to function as an acoustic reflector reflecting acoustic waves. The piezoelectric layer 103 comprises a first surface in contact with the lower electrode 102 and a second surface in contact with the upper electrode 104. An optional passivation layer 105 is provided over the upper electrode 104. As will become clearer as the present description continues, the substrate 101 comprises a material that is not only amenable by known microfabrication and semiconductor processing methods, but also has a comparatively good thermal conductivity. Generally, the substrate 101 comprises silicon (i.e., polycrystalline or monocrystalline), but other materials, such as gallium arsenide (GaAs) and indium phosphide (InP), are contemplated.

Opening 117 is provided in the upper electrode 104 and the passivation layer 105. Notably, no electrical connections extend across the opening 117 from one side to another.

The opening 117 is not made in layers beneath the upper electrode (e.g., the piezoelectric layer 103, or the lower electrode 102). The opening 117 is provided during fabrication of the upper electrode 104 and passivation layer 105 using known masking methods. As will be appreciated from a review of FIG. 1B, the opening 117 comprises a hole in the upper electrode 104, with the sides of the hole defined by the upper electrode 104, and the interior bottom surface of the hole defined by the upper surface of the piezoelectric layer 103. As noted above, in certain embodiments, the opening 117 is located substantially at the centroid of the BAW resonator 100, and has an areal dimension that approximates the area that would observe an unacceptable amount of self-heating in a comparable BAW as discussed above.

A pillar 120 is disposed in the cavity 116 and is aligned within the opening 117 as discussed in the embodiment shown in FIG. 1A. As shown, the pillar 120 contacts a portion of the lower electrode 102 disposed beneath the opening 117. The pillar 120 makes physical contact with the lower electrode 102, and is not located in the active area of the BAW resonator 100.

Generally, the pillar 120 has a cross-sectional shape that is the same as the shape of the opening 117. In accordance with representative embodiments described herein, the pillar 120 has a cross-sectional area in the range of approximately $3.0 \ \mu m^2$ to approximately $1.25 \times 10^5 \ \mu m^2$. The cross-sectional area may be approximately less than 30% of the active area of the BAW resonator 100.

In accordance with a representative embodiment, the pillar 120 comprises the same material as the substrate 101, which is illustratively silicon or other useful material used in the fabrication of BAW resonators. In such an embodiment, the pillar 120 is formed during the fabrication of the cavity 116 through known masking, and dry or wet etching methods that would be readily apparent to one of ordinary skill in the art.

Alternatively, in accordance with another representative embodiment, rather than silicon, the pillar 120 is made from a high thermal conductivity material. High thermal conductivity materials contemplated include but are not limited to diamond, boron arsenide, boron binary (carbide, nitride), silicon carbide (SiC) (thermal conductivity of 300 W/mk). Notably, silicon has a thermal conductivity of approximately 150 W/mK. The noted high thermal conductivity materials have a thermal conductivity material in the range of approximately 900 W/mK to approximately 2200 W/mK. Among other benefits, a pillar made from a high thermal conductivity material provides a reduced thermal resistance compared to a pillar made of silicon and having the same diameter of the pillar 120 (or cross-sectional area if the pillar is not cylindrical).

The region of contacting overlap of the lower and upper electrodes 102, 104, the piezoelectric layer 103 and the cavity 116 is referred to as the active area of the BAW resonator 100. When an electrical signal is applied, acoustic motion of particles is launched and propagated in this area. This acoustic motion contributes to the self-heating of the BAW resonator 100 described above. The portions of the inactive area that contact the substrate 101 and the pillar 120 may be referred to collectively as an anchor point of the BAW resonator 100 (in this case FBAR).

As noted above, the pillar 120 functions as an anchor point, or thermal ground, in same way as the anchor point of the substrate 101 described above. To this end, the pillar 120 reduces the overall thermal resistance of the BAW resonator 100 by providing a path to thermal ground, and beneficially contributes to thermal dissipation in the area of the opening 117, which is otherwise susceptible to overheating as observed in a comparable BAW resonator that is without the pillar 120 and/or the opening 117. Beneficially, the pillar 120 provides additional thermal grounding to the active area of the BAW resonator 100 where the heat generated in the active area can dissipate. In other words, the thermal resistance of the BAW resonator 100 is reduced by adding the pillar 120, which reduces the operating temperature for a given dissipated power. Finally, by dissipating heat more effectively, the pillar 120 and the opening 117 of the present teachings augment the power handling threshold for failures related to excessive dissipated power.

In the depicted embodiment, there is one opening 117, and one pillar 120. This is merely illustrative. As described more fully below, there may be more than one opening in the BAW resonator 100. Moreover, and as described more fully below, one or more pillars may be disposed in the opening 117. Accordingly, the present teachings contemplate one or more openings 117 having one pillar 120 disposed therein; or one or more openings 117 with more than one pillar 120 disposed therein; or both.

The pillar 120 is generally columnar in shape having a cross-section in the x-y plane of the coordinate system shown in FIG. 1B that is one of a variety of shapes, including but not limited to circular, elliptical, hexagonal, or any other irregular shape.

In the representative embodiment depicted in FIG. 1B, a recessed frame element 130 is disposed in the upper electrode 104. Similarly, a raised frame element 132 and a cantilevered portion 134 are provided in the upper electrode 104 and extend along the perimeter of the opening 117, and along the outer perimeter of the BAW resonator 100. The recessed frame element 130, the raised frame element 132 and the cantilevered portion 134 provides an improvement in the Q-factor at the parallel resonance frequency (Qp) and some improvement in the Q-factor at the series resonance frequency (Qs). As alluded to above, the use of recessed frame element 130, raised frame element 132 and cantilevered portion 134, although optional, is particularly beneficial around the perimeter of the opening 117 to foster reflections of acoustic waves along the perimeter of the opening 117 to reduce the likelihood of energy loss through the opening and the pillar 120.

Notably, the areal dimension of the cross-section of the pillar 120 at the point of contact of the pillar 120 with the opening 117 is less than the areal dimension of the opening. As such, and for reasons described more fully below, in accordance with a representative embodiment, a gap 'G' exists between the inner edge of the cantilevered portions 134 and the outer edge of the pillar 120. It is contemplated that in a BAW resonator (not shown) that does not include the cantilevered portion 134, a gap 'G' still exists between an inner edge of the upper electrode 104 and the outer edge of the pillar 120. Generally, but not necessarily, the gap 'G' is substantially constant in magnitude, and as such, the shape of the opening 117 is the same as the shape of the pillar 120.

The lower and upper electrodes 102, 104 each comprises one or two (bi-electrode) electrically conductive materials (e.g., Mo, W, Pt, Ru, Al, Ta, Cu, or Ru) and when an oscillating electrical signal is applied provide an oscillating electric field in the z-direction of the coordinate system shown (i.e., the direction of the thickness of the substrate 201). In the illustrative embodiment described presently, the z-axis is the axis for the TE (thickness-extensional or "longitudinal") mode(s) for the BAW resonator 100. In a representative embodiment, the piezoelectric layer 103 and lower and upper electrodes 102, 104 are suspended over a cavity 116 that substantially provides acoustic isolation with the substrate 101. Accordingly, the BAW resonator 100 is a mechanical resonator, which can be electrically coupled via the piezoelectric layer 103. Other configurations that foster mechanical resonance by FBARs are contemplated.

The piezoelectric layer 103 comprises a highly textured piezoelectric layer (e.g., AlN), and thus has a well-defined C-axis. As described more fully below, in an apparatus comprising a plurality of BAW resonators 100, the polarization of each BAW resonator impacts the type of the connection (e.g., series connection, anti-series connection) that is made between the BAW resonators 100. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 103, such as by methods described in the above-referenced U.S. Pat. Nos. 9,243,316 and 8,673,121 to Larson III, et al., is useful in apparatuses comprising BAW resonator 100.

In addition to being highly-textured, the piezoelectric layer 103 of representative embodiments may also comprise one or more rare-earth (e.g., scandium (Sc)) doped layers of piezoelectric material (e.g., aluminum nitride (AlN)) such as described in certain patent applications incorporated by reference above (e.g., U.S. Pat. No. 9,679,765 to John L. Larson III; and U.S. Pat. No. 9,455,681 to Feng, et al.).

Figure 2:
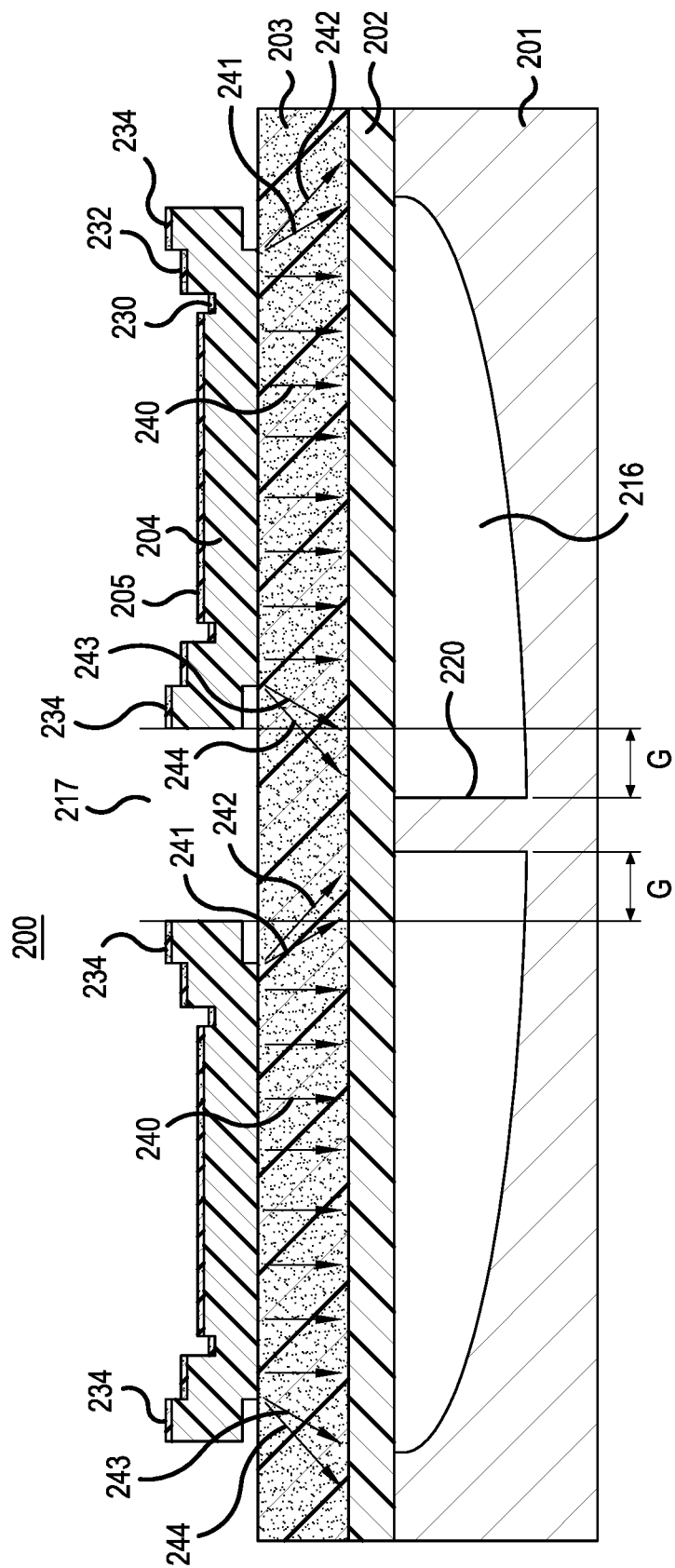
FIG. 2 is a cross-sectional view of the BAW resonator of FIG. 1B showing electric field lines in accordance with a representative embodiment.

FIG. 2 shows a cross-sectional view of BAW resonator 200 in accordance with a representative embodiment. As can be appreciated, the BAW resonator 200 comprises an FBAR.

The BAW resonator 200 comprises a substrate 201, a cavity 216, a lower electrode 202 disposed beneath a piezoelectric layer 203, and an upper electrode 204 disposed thereover. As shown in FIG. 2A and other embodiments throughout this disclosure, the lower electrode 202 may be disposed over the cavity 216. The cavity 216 may be filled with air or other material that enable the cavity 216 to function as an acoustic reflector reflecting acoustic wave. The piezoelectric layer 203 comprises a first surface in contact with the lower electrode 202 and a second surface in contact with the upper electrode 204. An optional passivation layer 205 is provided over the upper electrode 204. As will become clearer as the present description continues, the substrate 201 comprises a material that is not only amendable to known microfabrication and semiconductor processing methods, but also has a comparatively good thermal conductivity. Generally, the substrate 201 comprises silicon (i.e., polycrystalline or monocrystalline), but other materials, such as gallium arsenide (GaAs) and indium phosphide (InP), are contemplated.

Opening 217 is provided in the upper electrode 204 and the passivation layer 205. Notably, no electrical connections extend across the opening 217 from one side to another.

The opening 217 is not made in layers beneath the upper electrode (e.g., the piezoelectric layer 203, or the lower electrode 202). The opening 217 is provided during fabrication of the upper electrode 204 and passivation layer 205 using known masking methods. As will be appreciated from a review of FIG. 2, the opening 217 comprises a hole in the upper electrode 204, with the sides of the hole defined by the upper electrode 204, and the interior bottom surface of the hole defined by the upper surface of the piezoelectric layer 203. As noted above, in certain embodiments, the opening 217 is located substantially at the centroid of the BAW resonator 200, and has an areal dimension that approximates the area that would observe an unacceptable amount of self-heating in a comparable BAW as discussed in connection with the representative embodiment of FIG. 1B.

A pillar 220 is disposed in the cavity 216 and is aligned within the opening 217 as discussed in the embodiment shown in FIG. 1. As shown, the pillar 220 contacts a portion of the lower electrode 202 disposed beneath the opening 217. The pillar 220 makes physical contact with the lower electrode 202, and is not located in the active area of the BAW resonator 200.

Generally, the pillar 220 has a cross-sectional shape that is the same as the shape of the opening 217. In accordance with representative embodiments described herein, the pillar 220 has a cross-sectional area in the range of approximately $3.0\ \mu m^2$ to approximately $1.25 \times 10^5\ \mu m^2$. The cross-sectional area may be approximately less than 30% of the active area of the BAW resonator 200.

In accordance with a representative embodiment, the pillar 220 comprises the same material as the substrate 201, which is illustratively silicon or another useful material used in the fabrication of BAW resonators. In such an embodiment, the pillar 220 is formed during the fabrication of the cavity 216 through known masking, and dry or wet etching methods that would be readily apparent to one of ordinary skill in the art.

Alternatively, and in accordance with another representative embodiment, rather than silicon, the pillar 220 is made from a high thermal conductivity material. High thermal conductivity materials contemplated include but are not limited to diamond, boron arsenide, boron binary (carbide, nitride), silicon carbide (SiC). Notably, silicon has a thermal conductivity of approximately 150 W/mK. The noted high thermal conductivity materials have a thermal conductivity material in the range of approximately 900 W/mK to approximately 2200 W/mK. Among other benefits, a pillar made from a high thermal conductivity material provides a reduced thermal resistance compared to a pillar made of silicon and having the same diameter of the pillar 220 (or cross-sectional area if the pillar is not cylindrical).

The region of contacting overlap of the lower and upper electrodes 202, 204, the piezoelectric layer 203 and the cavity 216 is referred to as the active area of the BAW resonator 200. When an electrical signal is applied, the acoustic motion of particles is launched and propagated in this area. This acoustic motion contributes to the self-heating of the BAW resonator 200 described above. The portion of the inactive area that contacts the substrate 201 and the pillar 220 may be referred to collectively as an anchor point of the BAW resonator 200 (in this case FBAR).

As noted above, the pillar 220 functions as an anchor point, or thermal ground, in same way as the anchor point of the substrate 201 described above. To this end, the pillar 220 reduces the overall thermal resistance of the BAW resonator 200 by providing a path to thermal ground, and beneficially contributes to thermal dissipation in the area of the opening 217, which is otherwise susceptible to overheating as observed in a comparable BAW resonator that is without the pillar 220 and/or the opening 217. Beneficially, the pillar 220 provides additional thermal grounding to the active area of the BAW resonator 200 where the heat generated in the active area can dissipate. In other words, the thermal resistance of the BAW resonator 200 is reduced by adding the pillar 220, which reduces the operating temperature for a given dissipated power. Finally, by dissipating heat more effectively, the pillar 220 and the opening 217 of the present teachings augment the power handling threshold for failures related to excessive dissipated power.

In the depicted embodiment, there is one opening 217, and one pillar 220. This is merely illustrative. As described more fully below, there may be more than one opening in the BAW resonator 200. Moreover, and as described more fully below, one or more pillars may be disposed in the opening 217. Accordingly, the present teachings contemplate one or more openings 217 having one pillar 220 disposed therein; or one or more openings 217 with more than one pillar 220 disposed therein; or both.

The pillar 220 is generally columnar in shape having a cross-section in the x-y plane of the coordinate system shown in FIG. 2A that is one of a variety of shapes, including but not limited to circular, elliptical, hexagonal, or any other irregular shape.

In the representative embodiment depicted in FIG. 2A, a recessed frame element 230 is disposed in the upper electrode 204. Similarly, a raised frame element 232 and a cantilevered portion 234 are provided in the upper electrode 204 and extend along the perimeter of the opening 217, and along the outer perimeter of the BAW resonator 200. The recessed frame element 230, the raised frame element 232 and the cantilevered portion 234 provides an improvement in the Q-factor parallel resonance (Qp) and some improvement in the Q-factor at series resonance (Qs). As alluded to above, the use of recessed frame element 230, raised frame element 232 and cantilevered portion 234, although optional, is particularly beneficial around the perimeter of the opening 217 to foster reflections of acoustic waves along the perimeter of the opening 217 to reduce the likelihood of energy loss through the opening and the pillar 220.

Notably, the areal dimension of the cross-section of the pillar 220 at the point of contact of the pillar 220 with the opening 217 that is less than the areal dimension of the opening. As such, and for reasons described more fully below, in accordance with a representative embodiment, a gap 'G' exists between the inner edge of the cantilevered portions 234 and the outer edge of the pillar 220. It is contemplated that in a BAW resonator (not shown) that does not include the cantilevered portion, a gap 'G' exists between an inner edge of the upper electrode 204 and the outer edge of the pillar 220. Generally, but not necessarily, the gap 'G' is substantially constant in magnitude, and as such, the shape of the opening 217 is the same as the shape of the pillar 220.

The lower and upper electrodes 202, 204 each comprises one or two (bi-electrode) electrically conductive materials (e.g., Mo, W, Pt, Ru, Al, Ta, Cu, or Ru) and when an oscillating electrical signal is applied provide an oscillating electric field in the z-direction of the coordinate system shown (i.e., the direction of the thickness of the substrate 201). In the illustrative embodiment described presently, the z-axis is the axis for the TE (thickness-extensional or "longitudinal") mode(s) for the BAW resonator 200. In a representative embodiment, the piezoelectric layer 203 and lower and upper electrodes 202, 204 are suspended over a cavity 216 that substantially provides acoustic isolation with the substrate 201. Accordingly, the BAW resonator 200 is a mechanical resonator, which can be electrically coupled via the piezoelectric layer 203. Other configurations that foster mechanical resonance by FBARs are contemplated.

The piezoelectric layer 203 comprises a highly textured piezoelectric layer (e.g., AlN), and thus has a well-defined C-axis. As described more fully below, in an apparatus comprising a plurality of BAW resonators 100, the polarization of each BAW resonator impacts the type of the connection (e.g., series connection, anti-series connection) that is made between the BAW resonators 100. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 203, such as by methods described in the above-referenced U.S. Pat. Nos. 9,243,316 and 8,673,121 to Larson III, et al., is useful in apparatuses comprising BAW resonator 100.

In addition to being highly-textured, the piezoelectric layer 203 of representative embodiments may also comprise one or more rare-earth (e.g., scandium (Sc)) doped layers of piezoelectric material (e.g., aluminum nitride (AlN)) such as described in certain patent applications incorporated by reference above (e.g., U.S. Pat. No. 9,679,765 to John L. Larson III; and U.S. Pat. No. 9,455,681 to Feng, et al.).

As noted above, longitudinal acoustic waves propagate along the thickness (z-direction in the coordinate system shown) in the piezoelectric layer 203. These acoustic waves are generated by the electric field (field lines depicted by the arrows 240). The propagation vector of these acoustic waves is parallel to the electric field lines (depicted by arrows 240). As can be seen however, from the edges of the upper electrode 204, fringing electric fields 241244 can arise in the piezoelectric layer 203. Unfortunately, and even though the upper electrode 204 is removed in the opening 217, these fringing fields can generate undesired (spurious) acoustic waves that radiate through the pillar 220 and into the substrate. As will be appreciated by one of ordinary skill in the art, generation of spurious acoustic modes by fringe electric fields can result in acoustic energy undesirably radiated through the pillar 220.

Accordingly, and as noted above, the gap 'G' is provided between the edge of the inner edge of the cantilevered portions 234 adjacent to the opening 217, and the edge of the pillar 220 as shown in FIG. 2. A parasitic capacitance may exist between the cantilevered portions 234 and the lower electrode 202 which could extend fringing electric fields 241, 242 into the portion of the piezoelectric layer 203 above the pillar 220 and such fringing electric fields are beneficially avoided. Therefore, gap 'G' has a dimension selected to be large enough so that any such fringing electric fields 241, 242 are sufficiently small in magnitude at the region of the piezoelectric layer 203 above the pillar 220 to substantially prevent the propagation of acoustic waves in the region of the piezoelectric layer 203 above the pillar 220. By way of illustration, and not limitation, the gap 'G' has a dimension that is approximately equal to the thickness (z-direction of the coordinate system of FIG. 2) of the piezoelectric layer 203.

By defining the gap 'G' as the distance between the inner edge of the cantilevered portion 234 and the pillar 220 as shown in FIG. 2, the lost active area by the opening is now slightly increased because the active area is defined by the overlap of bottom and top electrode accounting for recessed frame element 230 and the raised frame element 232, but not accounting for the cantilevered portion, which is suspended in air. To maintain the resonator impedance, the area of the BAW resonator 200 is increased by the area of the opening 217, (plus the area under the cantilevered portion 234, when the cantilevered portion 234 is present). Moreover, because spurious modes are suppressed by the frame at the perimeter of the opening the energy carried by lateral modes travelling in-plane does not radiate out through the pillar 220 thus preserving Q of the resonator. The reduction of acoustic energy loss by the placement of the gap (G), in combination with the reduction of loss of acoustic energy accorded by the recessed frame element 230, the raised frame element 232 and the cantilevered portion 234, results in an improvement in the Q and the Rp of the BAW resonator 200.

Figure 3:
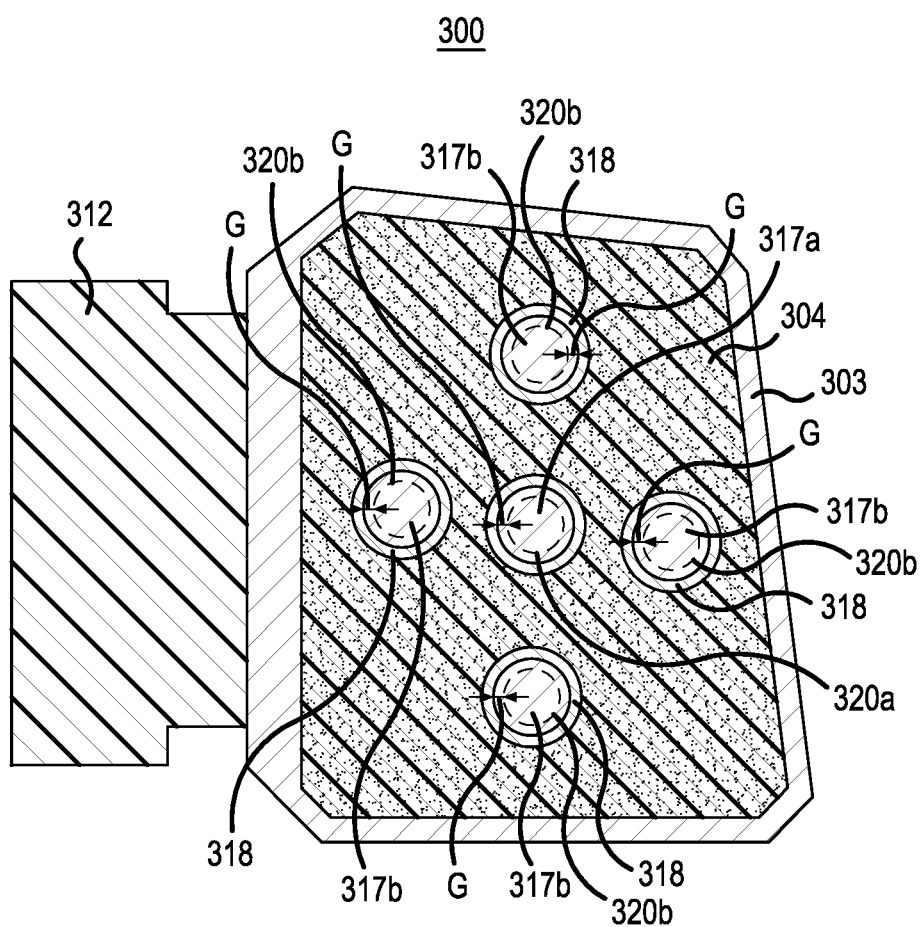
FIG. 3 is a top view of a bulk acoustic wave (BAW) resonator in accordance with a representative embodiment.

FIG. 3 is a top view of a bulk acoustic wave (BAW) resonator 300 in accordance with a representative embodiment.

The BAW resonator 300 comprises a lower electrode (not shown in FIG. 3) disposed over a substrate (not shown in FIG. 3), and an upper electrode 304 disposed over a piezoelectric layer 303. A passivation layer (not shown in FIG. 3) may be provided over the upper electrode, as may other components (not shown in FIG. 3), such as mass loading layers that are useful in tuning the frequency of the BAW resonator 300.

The BAW resonator 300 comprises an interconnect 312 for providing a signal input or signal output to the upper electrode 304. A bridge (not shown in FIG. 3) may be optionally provided between the upper electrode 304 and the interconnect 312; and cantilevered portions (not shown in FIG. 3) may be provided over one or more of the sides of the upper electrode 304, excepting the side of the interconnect 312.

The region of contacting overlap of the lower electrode (not shown in FIG. 3), upper electrode 304, the piezoelectric layer 303 and the cavity (not shown in FIG. 3) is referred to as an active area of the BAW resonator 300. When an electrical signal is applied to the resonator 300, the acoustic motion of particles is launched and propagated in this area. This acoustic motion contributes to the self-heating of the BAW resonator 300.

A plurality of openings 317a, 317b are provided in the upper electrode 304. The plurality of openings 317a, 317b is not made in layers beneath the upper electrode (e.g., the piezoelectric layer 303, or the lower electrode (not shown in FIG. 3). Notably, no electrical connections extend across any of the plurality of openings 317a, 317b from one side to another.

As will be appreciated from a review of FIG. 3, for example, each of the openings 317a, 317b comprises a hole in the upper electrode 304, with the sides of the hole made of the upper electrode 304, and bottom surface of the hole made of the piezoelectric layer 303.

The regions where the plurality of openings 317a, 317b (or pillars 320a, 320b) are located may be determined by multiple factors. One factor may be the consideration as discussed in the embodiments shown in FIG. 1A and FIG. 1B. For example, the opening 317a and the pillar 320a may be placed in an area where unacceptable self-heating is observed in a comparable BAW resonator when an electrical signal is applied. Other factors such as further enhancement of heat dissipation, mechanical stability of the BAW resonator structure may also be considered. For example, other openings 317b (or pillars 320b) may be placed surrounding the opening 317a (or pillar 320a) to reduce the distance of heat traveling to the edge of the BAW resonator 300, thereby further enhancing heat dissipation. In the embodiment shown in FIG. 3, the pillars 320b (or openings 317b) may be optionally equidistantly spaced apart from the pillar 320a (or opening 317a).

The total perimeter of the BAW resonator 300 is adjusted to provide sufficient thermal grounding in order to beneficially reduce the temperature under operation. The total perimeter is also controlled to reduce excessive loss of radiated power that could degrade Q and Rp. The shortest distance from one side of the BAW resonator 300 to another is also controlled and the sides are apodized to reduce the magnitude of in-plane waves that could degrade in-band insertion loss and generate second harmonic emissions.

A pillar 320a or 320b is disposed beneath each of the plurality of openings 317a, 317b. As will be appreciated, the pillar 320a, 320b contacts a portion of the lower electrode disposed beneath the respective openings 317a, 317b. In addition to providing mechanical stability to the membrane of the BAW resonator 300, the pillars 320a, 320b provide a thermal sink, which beneficially dissipates heat from the region of the plurality of openings 317a, 317b. Again, a gap 'G' exists. Generally, the pillars 320a, 320b each have a cross-sectional shape that is the same as the shape of their respective opening 317a, 317b. In accordance with representative embodiments described herein, the pillar 320a, 320b has a cross-sectional area in the range of approximately 3.0 $\mu m^2$ to approximately 1.25×10$^5$ $\mu m^2$. The cross-sectional area may be approximately less than 30% of the active area of the BAW resonator 300.

As described above, recessed frame elements and the raised frame elements, which are shown generally at 318, are optional but provided along each of the perimeter of the plurality of openings 317a, 317b, and therefore form a portion of the perimeter of the active area of the BAW resonator 300. The provision of frame elements has the benefit to reducing acoustic energy loss, and therefore improving the quality-factor (Q) of the BAW resonator 300. However, reflections of acoustic waves at the frame elements provided along the perimeter of the plurality of openings 317a, 317b also reduce the likelihood of energy loss through the pillars 320a, 320b.

The BAW resonator 300 may optionally comprise a bridge (not shown) along the interconnection side 312. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 300.

Because the thermal resistance is greater from the geometric center of a comparable BAW resonator to the edge (anchor point) of the comparable BAW resonator than it is from points on the comparable BAW resonator closer to the edge (anchor point) of the comparable BAW resonator, the propensity for unacceptable levels of self-heating when subject to an electrical signal in the comparable BAW is great. By thermal conduction (interaction between phonons-electrons) the heat (thermal wave) is partially evacuated from the active area of the comparable BAW resonator farther away into the substrate, which helps to cool down the active area. As air is a comparatively poor thermal conductor, there is no significant heat conduction through the air. Similarly since the cavity typically has a poor thermal conductivity, there is little heat flow out of the bottom of the comparable resonator. However, the heat can be evacuated from the active area only by flowing through the anchor points. Thus, a thermal gradient is generated in the x-y plane. As noted, in the comparable BAW resonator without the pillar 320a, 320b and/or opening 317a, 317b, the center or central portion of the active area (membrane when over a cavity), which is located closer to the anchor point with substrate, is hotter than the perimeter of the active area. As noted, in the comparable BAW resonator, the center or central portion of the active area (membrane when over a cavity), near the geometric center (centroid) of the active area, is hotter than the perimeter of the active area when an electrical signal is applied. As such, the distance the heat has to travel from the center of the BAW resonator to the edge is comparatively large, and therefore the thermal resistance in comparatively high. In addition, there is potentially more non-uniform stress/strain in the active area as it gets larger. Ultimately, the comparable BAW resonator can operate at unacceptably high temperatures, which can reduce its electrical performance (mainly manifest in a reduced quality factor (Q) and a reduced electromechanical coupling coefficient ($kt^2$)); reduce its power handling; degrade its insertion loss, as compared to the comparable BAW resonators which is without the pillar 320a, 320b and/or the opening 317a, 317b.

Each of the plurality of pillars 320a, 320b is disposed in the cavity (not shown in FIG. 3), and is aligned with the opening 317a, 317b. Through careful placement of the plurality of pillars 320a, 320b, substantially no electric field exists in the region of the BAW resonator 300 at the opening, and energy cannot be absorbed in the region of the plurality of openings 317a, 317b and by the pillar 320a, 320b. Beneficially, therefore, eliminating the ability for the piezoelectric effect to be supported in each of the plurality of openings 317a, 317b eliminates the generation of acoustic waves in the region of each of the plurality of openings 317a, 317b, and thus eliminates the electric field, and thus the heat source in this region of the BAW resonator 300. Furthermore, by providing at least one pillar 320a, 320b aligned with each of the plurality of openings 317a, 317b, and touching a portion of the lower electrode (not shown in FIG. 3) disposed beneath a respective one of the plurality of openings 317a, 317b, additional thermal grounds are provided in the regions of the plurality of openings 317a, 317b. These thermal grounds further reduce self-heating of the BAW resonator 300. As noted above, according to a representative embodiment, the plurality of openings 317a, 317b are located at substantially the greatest distance from an anchor point of BAW resonator 300 to provide beneficial elimination of the region of the active area of the BAW resonator.

In other embodiments, the regions where the plurality of openings 317a, 317b and the plurality of pillars 320a, 320b are located may not be limited to the regions where self-heating may be otherwise become unacceptable as observed in a comparable BAW discussed above. Often, the plurality of pillars 320a, 320b and the plurality of openings 317a, 317b may be more than minimally required. The pillars 320a, 320b may be placed in accordance with heat dissipation and/or mechanical stability considerations as discussed above. In such embodiments, the plurality of pillars 320a, 320b and the plurality of openings 317a, 317b may be arranged in a linear array, in an array form or in other alternative ways as long as an adequate overall heat dissipation is satisfied. For example, the plurality of pillars 320a, 320b may be arranged so that one of pillars 320a, 320b is a center pillar and the remaining of plurality of pillars 320a, 320b, which may be identical or different in size, are placed surrounding the center pillar. In addition, the remaining of plurality of pillars 320a, 320b may be equidistantly spaced apart from the center pillar 320a, 320b. In yet another embodiment, the plurality of pillars 320a, 320b may be distributed such that a pillar density per unit area is substantially the same. Other than the location of the plurality of openings 317a, 317b and the plurality of pillars 320a, 320b, other aspects of the BAW resonators in those other embodiments are substantially similar to the embodiment shown in FIG. 3. For example, the plurality of pillars 320a, 320b and the plurality of openings 317a, 317b are optionally substantially aligned.

Accordingly, the overall thermal profile of the BAW resonator 300 is beneficially reduced. This reduction in self-heating enables application of RF signals to the BAW resonator 300 having greater electrical power, with a substantially reduced incidence of unacceptable levels of self-heating. As can be appreciated, this improves the overall performance and reliability of the BAW resonator 300. Specifically, when compared to comparable BAW resonators, BAW resonator 300 has an improved Q, an improved acoustic coupling coefficient ($kt^2$), improved power handling and less degradation of insertion loss; moreover, there is less, if any, shift in the passband of a filter comprising one or more of BAW resonator 300 of the present teachings.

Figure 4:
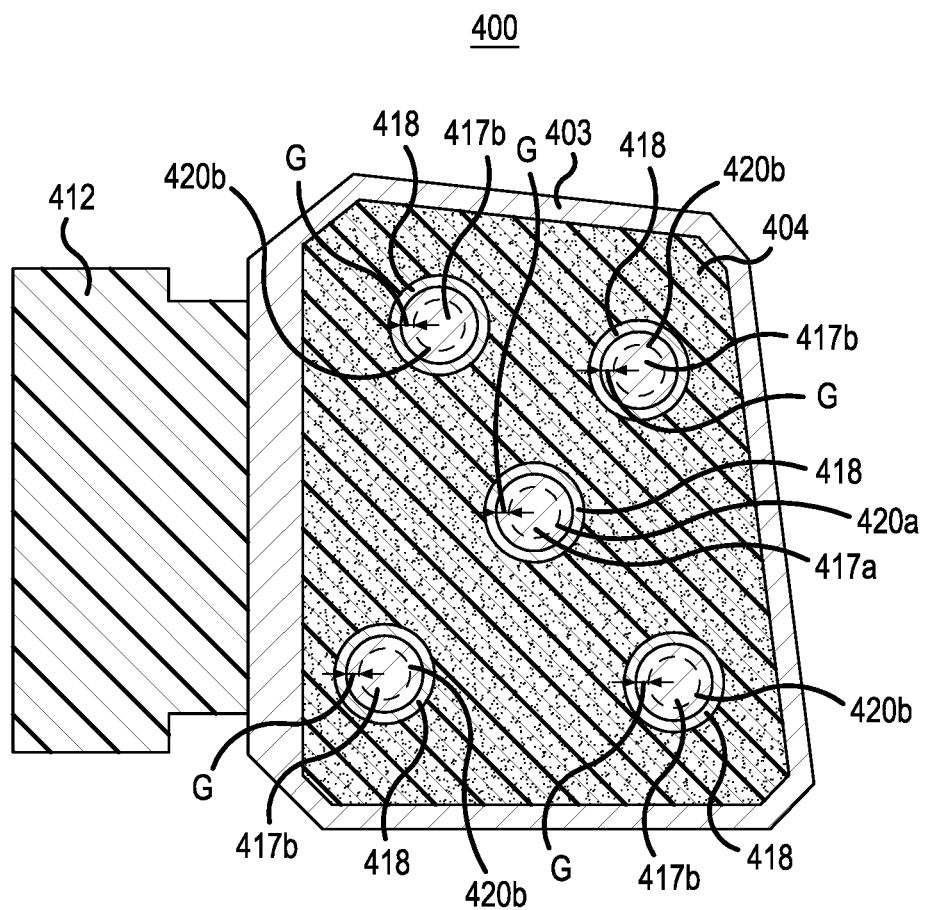
FIG. 4 is a top view of a bulk acoustic wave (BAW) resonator in accordance with a representative embodiment.

FIG. 4 is a top view of a bulk acoustic wave (BAW) resonator 400 in accordance with a representative embodiment.

The BAW resonator 400 comprises a lower electrode (not shown in FIG. 4) disposed over a substrate (not shown in FIG. 4), and an upper electrode 404 disposed over a piezoelectric layer 403. A passivation layer (not shown in FIG. 4) may be provided over the upper electrode, as may other components (not shown in FIG. 4), such as mass loading layers that are useful in improving the performance of the BAW resonator 400.

The BAW resonator 400 comprises an interconnect 412 for providing a signal input or signal output to the upper electrode 404. A bridge (not shown in FIG. 4) may be optionally provided between the upper electrode 404 and the interconnect 412; and cantilevered portions (not shown in FIG. 4) may be provided over one or more of the sides of the upper electrode 404, excepting the side of the interconnect 412.

The region of contacting overlap of the lower electrode (not shown in FIG. 4), upper electrode 404, the piezoelectric layer 403 and the cavity (not shown in FIG. 4) is referred to as an active area of the BAW resonator 400. When an electrical signal is applied to the BAW resonator 400, the acoustic motion of particles is launched and propagated in this area. This acoustic motion contributes to the self-heating of the BAW resonator 400. A plurality of openings 417a, 417b is provided in the upper electrode 404. The plurality of openings 417a, 417b is not made in layers beneath the upper electrode (e.g., the piezoelectric layer 403, or the lower electrode (not shown in FIG. 4). As will be appreciated, each of the plurality of openings 417a, 417b comprises a hole in the upper electrode 404, with the bottom and sides of the hole made of the upper electrode 404, and the interior bottom surface of the hole made of the upper surface of piezoelectric layer 403. Notably, no electrical connections extend across any of the plurality of openings 417a, 417b from one side to another. The BAW resonator 400 is substantially similar to the BAW resonator 300 except that the placement of the plurality of openings 417b and the plurality of pillars 420b is different.

Notably, care must be taken not to locate any of the openings too close to the outer perimeter of the active area of the BAW resonator 400 to reduce acoustic loss by wave propagation through the substrate. Generally, the openings 417a, 417b are disposed far enough away from the perimeter of the active area of the BAW resonator 400 to limit undesirable rattles caused by spurious modes to gain in magnitude and the total perimeter is controlled such that Rp is maintained at an optimum level.

A pillar 420a or 420b is disposed beneath each of the plurality of openings 417a, 417b. As will be appreciated the pillar 420a or 420b contacts a portion of the lower electrode disposed beneath the opening 417a or 417b. In addition to providing mechanical stability to the membrane of the BAW resonator 400, the pillars 420a, 420b provide a thermal sink, which beneficially dissipates heat from the region of the plurality of openings 417a, 417b. As described more fully herein, gaps 'G' exists as shown. Generally, the pillars 420a, 420b each have a cross-sectional shape that is the same as the shape of their respective opening 417a or 417b. In accordance with representative embodiments described herein, each pillar 420a or 420b has a cross-sectional area in the range of approximately 3.0 $\mu m^2$ to approximately 1.25× $10^5$ $\mu m^2$. The cross-sectional area may be approximately less than 30% of the active area of the BAW resonator 400.

The frame elements, which are shown generally at 418 are optionally provided along each of the perimeter of the plurality of openings 417a, 417b, and therefore form a portion of the perimeter of the active area of the BAW resonator 400. The provision of frame elements has the benefit of to reducing acoustic energy loss, and therefore improving the quality-factor (Q) of the BAW resonator 400. However, reflections of acoustic waves at the frame elements provided along the perimeter of the plurality of openings 417a, 417b also reduce the likelihood of energy loss through the pillar 420a, 420b described below.

The BAW resonator 400 may optionally comprise a bridge (not shown) along the interconnection side 412. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 400.

Each of the plurality of pillars 420a, 420b is disposed in the cavity (not shown in FIG. 4), and is aligned with the opening. Through careful placement of the plurality of pillars, substantially no electric field exists in the region of the BAW resonator 400 at the opening in the region of the plurality of openings 417a, 417b and by the pillar 420a, 420b. By providing at least one pillar 420a or 420b aligned with each of the plurality of openings 417a, 417b, and touching the portion of the lower electrode 402 disposed beneath the openings 417a, 417b, additional thermal grounds are provided in the regions of the plurality of openings 417a, 417b, which further enhances heat dissipation of the BAW resonator 400. Moreover, multiple openings, each having a pillar disposed therein, are located in a way that reduces the maximum temperature even more because the outer perimeter is increased as noted above. This affords better thermal grounding at the anchor points along the outer perimeter of the BAW resonator 400, thus reducing the thermal resistance. So, in addition to providing opening 417a in location where otherwise the BAW resonator 400 would become undesirably hot as observed in a comparable BAW resonator, the openings 417b further increase the outer perimeter of the BAW resonator 300, which beneficially adds to a reduction of thermal resistance, and improved heat dissipation.

Figure 5:
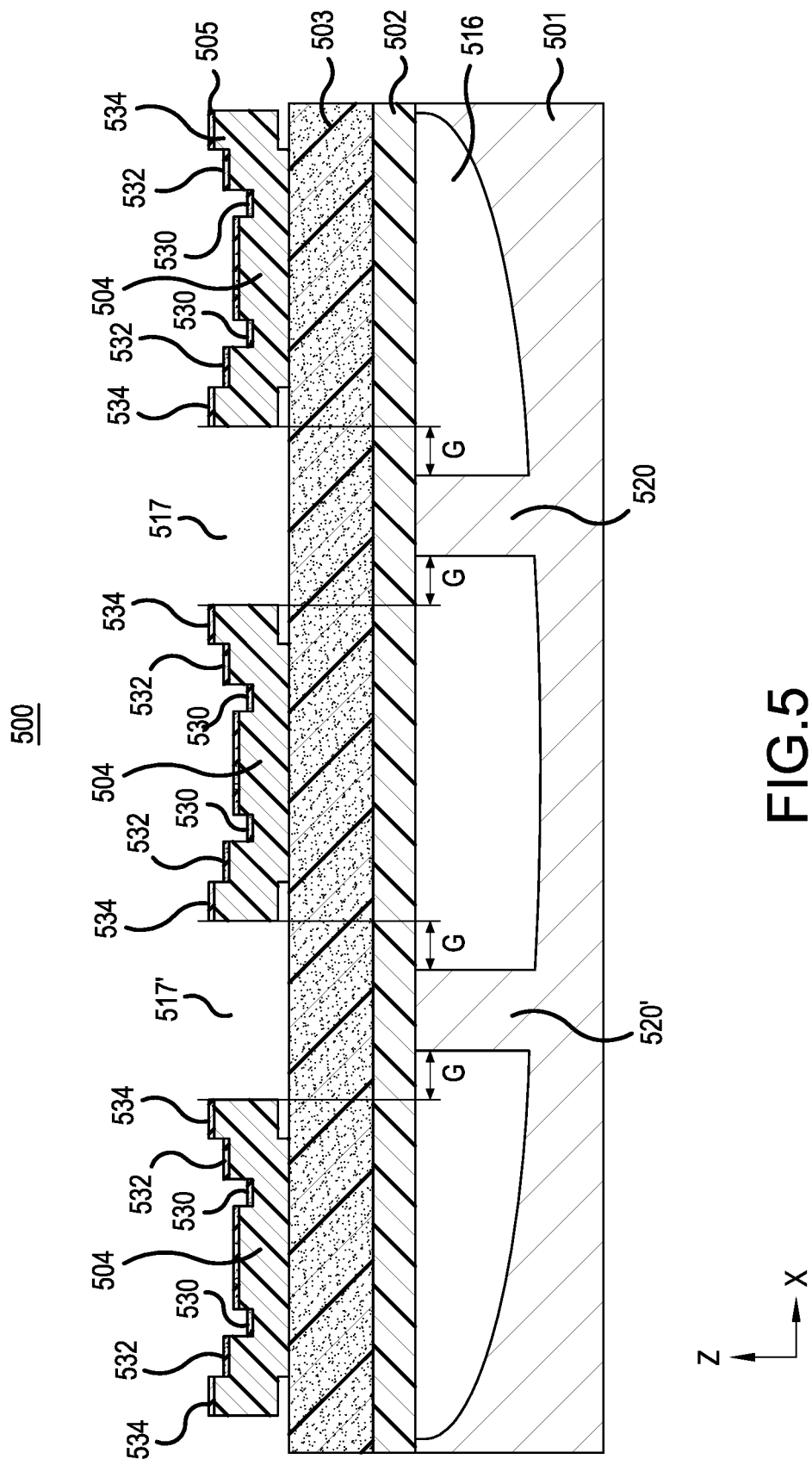
FIG. 5 is a cross-sectional view of a BAW resonator in accordance with a representative embodiment.

FIG. 5 depicts a cross-sectional view of a BAW resonator 500 contemplated for use in the various apparatuses of the present teachings. As can be appreciated, the BAW resonator 500 comprises an FBAR. Certain aspects of the BAW resonator 500 are common to the BAW resonators of FIGS. 1A-4. Most notably, the cross-sectional view of FIG. 5 shows a BAW resonator with multiple openings in the upper electrode, and multiple pillars such as depicted in FIGS. 3 and 4. The common aspects and details of the representative embodiment of FIG. 5 to those of the representative embodiments of FIGS. 1A-4 may not be repeated to ensure clarity of the presently described embodiments.

The BAW resonator 500 comprises a substrate 501, a lower electrode 502 disposed beneath a piezoelectric layer 503, and an upper electrode 504 disposed thereover. The piezoelectric layer 503 comprises a first surface in contact with the lower electrode 502 and a second surface in contact with the upper electrode 504. An optional passivation layer 505 is provided over the upper electrode 504. As will become clearer as the present description continues, the substrate 501 comprises a material that is not only amendable by known microfabrication and semiconductor processing methods, but also has a comparatively good thermal conductivity. Generally, the substrate 501 comprises silicon (i.e., polycrystalline or monocrystalline), but other materials, such as gallium arsenide (GaAs) and indium phosphide (InP), are contemplated.

Openings 517, 517' are provided in the upper electrode 504 and the passivation layer 505. The openings 517, 517' are not made in layers beneath the upper electrode (e.g., the piezoelectric layer 503, or the lower electrode 502). As will be appreciated from a review of FIG. 5, the openings 517, 517' comprise holes in the upper electrode 504, with the sides of the holes defined by the upper electrode 504, and the bottom surfaces of the holes defined by the piezoelectric layer 503. Notably, no electrical connections extend across any of the plurality of openings 517, 517' from one side to another.

The openings 517, 517' are provided during fabrication of the upper electrode 504 and passivation layer 505 using known masking methods. As noted above, in certain embodiments, the openings 517, 517' are located substantially at the geometric center or central portion of the active area of the BAW resonator 500.

Pillars 520, 520' are disposed in the cavity 516 and are aligned within the openings 517, 517' as shown, similar to the embodiment shown in FIG. 1A. The pillars 520, 520' contact respective portions of the lower electrode 502 disposed beneath the openings 517, 517'. The pillars 520, 520' make physical contact with the lower electrode 502, and are not located in the active area of the BAW resonator 500.

In addition to providing mechanical stability to the membrane of the BAW resonator 500, the pillars 520, 520' provide a thermal sink, which beneficially dissipates heat from the region of the plurality of openings 517, 517'. Generally, the pillars 520, 520' each have a cross-sectional shape that is the same as the shape of their respective opening 517, 517'. In accordance with representative embodiments described herein, each of the pillars 520,520' has a cross-sectional area in the range of approximately 3.0 $\mu m^2$ to approximately $1.25 \times 10^5$ $\mu m^2$. The cross-sectional area may be approximately less than 30% of the active area of the BAW resonator 500.

In accordance with a representative embodiment, the pillars 520, 520' comprise the same material as the substrate 501, which is illustratively silicon or another useful material used in the fabrication of BAW resonators. In such an embodiment, the pillars 520, 520' are formed during the fabrication of the cavity 516 through known masking, and dry or wet etching methods that would be readily apparent to one of ordinary skill in the art.

Alternatively, and in accordance with another representative embodiment, rather than silicon, the pillars 520, 520' are made from a high thermal conductivity material. High thermal conductivity materials contemplated include but are not limited to diamond, boron arsenide, boron binary (carbide, nitride), silicon carbide (SiC) Notably, silicon has a thermal conductivity of approximately 150 W/mK. The noted high thermal conductivity materials have a thermal conductivity material in the range of approximately 900 W/mK to approximately 2200 W/mK. Among other benefits, a pillar made from a high thermal conductivity material provides a reduced thermal resistance compared to a pillar made of silicon and having the same diameter of the pillar 520 (or cross-sectional area if the pillar is not cylindrical).

The region of contacting overlap of the lower and upper electrodes 502, 504, the piezoelectric layer 503 and the cavity 516 is referred to as the active area of the BAW resonator 500. When an electrical signal is applied to the resonator 500, the acoustic motion of particles is launched and propagated in this area. This acoustic motion contributes to the self-heating of the BAW resonator 500 described above.

As noted above, the pillars 520, 520' function as anchor points, or thermal grounds, in same way as the anchor point of the substrate 501 described above. To this end, the pillars 520, 520' reduce the overall thermal resistance of the BAW resonator 500 by providing a larger perimeter in contact with the substrate thus increasing the thermal ground, and beneficially contributes to thermal dissipation in the area of the openings 517, 517'. In the depicted embodiment, each of the openings 517, 517', has one pillar 520, 520' aligned therewith. This is merely illustrative. As described more fully below, at least some of the plurality of openings 517, 517' may have more than one pillar (i.e., a plurality of pillars (e.g., as shown in FIGS. 6B, 6C) disposed therein. As such, one or more pillars may be disposed in each of the openings 517, 517'. Accordingly, the present teachings contemplate one or more openings 517, 517' with one pillar 520, 520' disposed therein; or one or more openings 517, 517' with more than one pillar (not shown in FIG. 5) disposed therein; or both.

The pillars 520, 520' are generally columnar in shape having a cross-section in the x-y plane of the coordinate system shown in FIG. 5 that is one of a variety of shapes, including but not limited to circular, elliptical or hexagonal. Notably, the areal dimension of the cross-sections of the pillars 520 at the point of contact of the pillar 520 with the openings 517, 517' that is less than the areal dimension of the opening. As such, and for reasons described more fully above, a gap 'G' exists between an inner edge of the upper electrode 504 and the outer edge of each of the pillars 520, 520'. Generally, but not necessarily, the gap 'G' is substantially constant in magnitude, and as such, the shape of the openings 517, 517' is generally the same as the shape of the respective pillars 520, 520'. The lower and upper electrodes 502, 504 each comprises one or two (bi-electrode) electrically conductive materials (e.g., Mo, W, Pt, Ru, Al, Ta, Cu, or Ru) and when an electrical signal is applied provide an oscillating electric field in the z-direction of the coordinate system shown (i.e., the direction of the thickness of the substrate 501). In the illustrative embodiment described presently, the z-axis is the axis for the TE (thickness-extensional or "longitudinal") mode(s) for the resonator. In a representative embodiment, the piezoelectric layer 503 and lower and upper electrodes 502, 504 are suspended over a cavity 516 that substantially provides acoustic isolation with the substrate 501. Accordingly, the BAW resonator 500 is a mechanical resonator, which can be electrically coupled via the piezoelectric layer 503. Other configurations that foster mechanical resonance by FBARs are contemplated.

In the representative embodiment depicted in FIG. 5, recessed frame elements 530 are disposed in the upper electrode 504. Similarly, raised frame elements 532 and cantilevered portions 534 are provided in the upper electrode 504 and extend along the perimeters of the openings 517, 517', and along the outer perimeter of the BAW resonator 500. The recessed frame elements 530, the raised frame elements 532 and the cantilevered portions 534 provide an improvement in the Q-factor at the parallel resonance frequency (Qp) and some improvement in the Q-factor at the series resonance frequency (Qs). As noted above, the use of recessed frame element 530, raised frame element 532 and cantilevered portion 534 is particularly beneficial around the perimeter of the openings 517, 517' to foster reflections of acoustic waves along the perimeter of the openings 517, 517' to reduce the likelihood of energy loss through the respective pillars 520, 520'.

The piezoelectric layer 503 comprises a highly textured piezoelectric layer (e.g., AlN), and thus has a well-defined C-axis. In an apparatus comprising a plurality of BAW resonators 100, the polarization of each BAW resonator impacts the type of the connection (e.g., series connection, anti-series connection) that is made between the BAW resonators 500. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 503, such as by methods described in the above-referenced U.S. Pat. Nos. 9,243,316 and 8,673,121 to Larson III, et al., is useful in apparatuses comprising BAW resonator 100.

In addition to being highly-textured, the piezoelectric layer 503 of representative embodiments may also comprise one or more rare-earth (e.g., scandium (Sc)) doped layers of piezoelectric material (e.g., aluminum nitride (AlN)) as described in certain patent applications incorporated by reference above (e.g., U.S. Patent Application Publication No. 20140132317 to John L. Larson III; and U.S. Patent Application Publication No. 20150244347 to Feng, et al.).

Figure 6A:
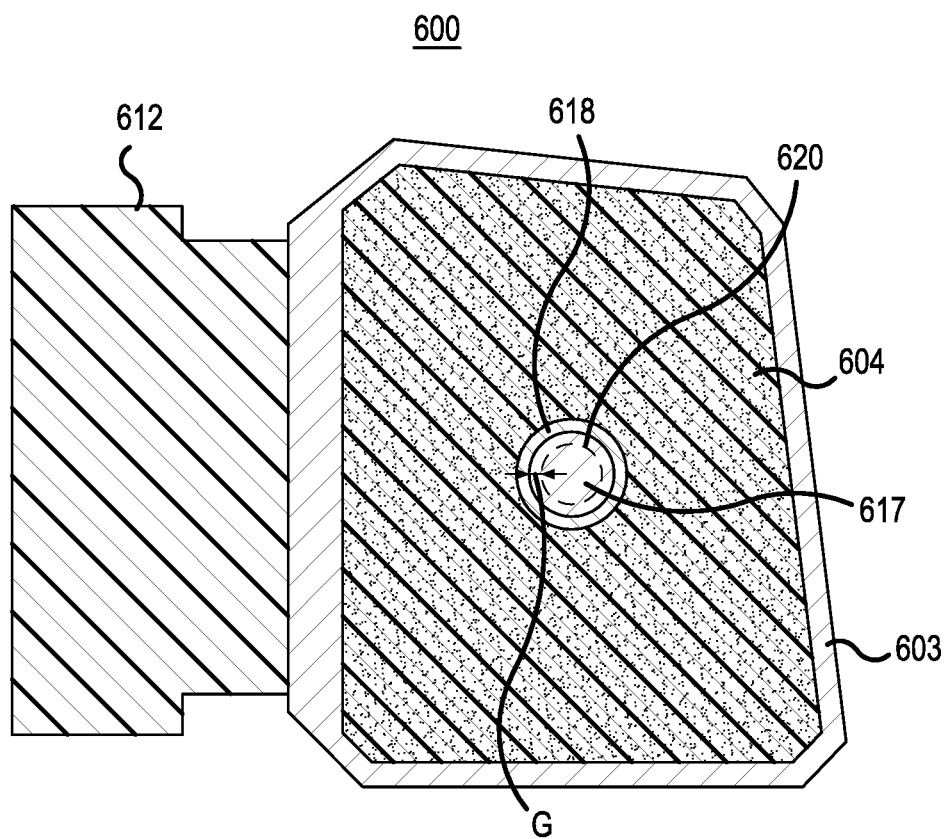
FIG. 6A is a top view of a bulk acoustic wave (BAW) resonator in accordance with a representative embodiment.
Figure 6B:
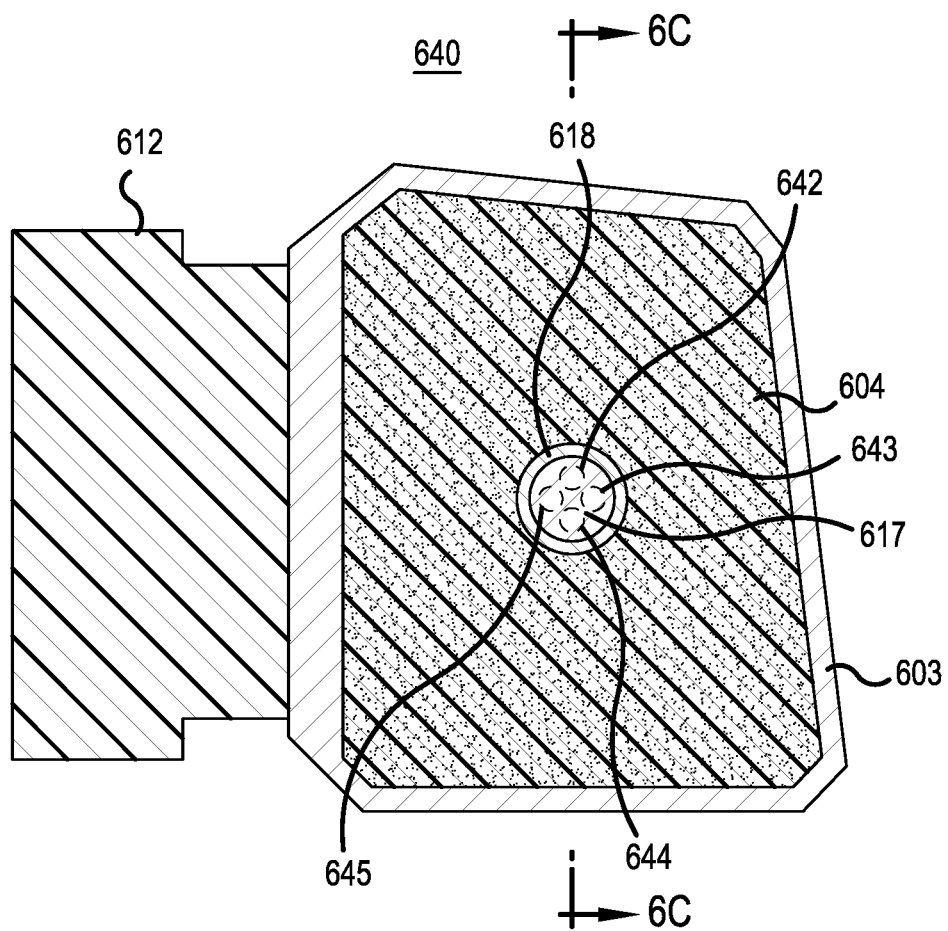
FIG. 6B is a top view of a bulk acoustic wave (BAW) resonator in accordance with a representative embodiment.
Figure 6C:
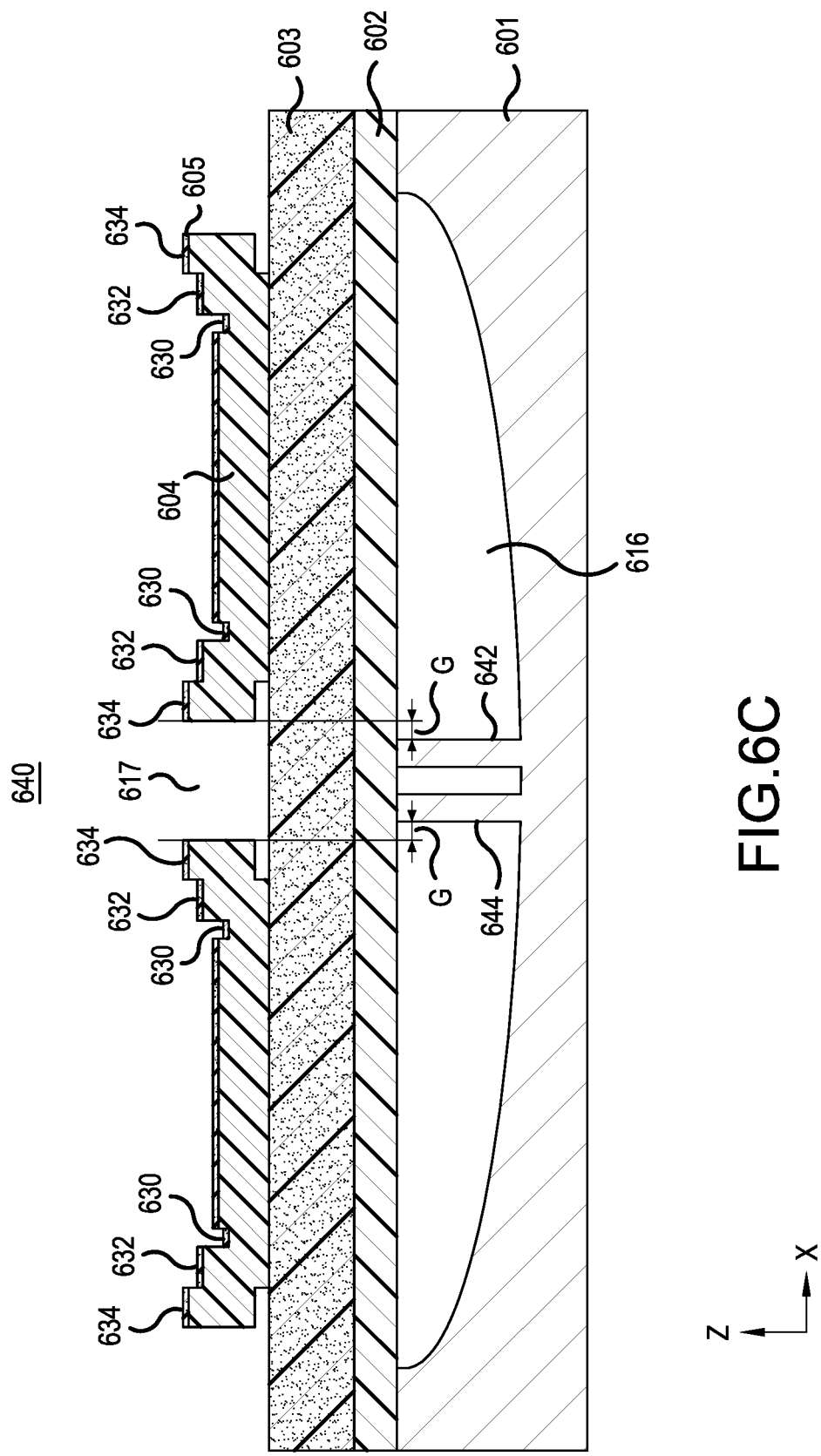
FIG. 6C depicts a cross-sectional view of the BAW resonator of FIG. 6B taken along the line 6C-6C.

FIG. 6A is a top view of a bulk acoustic wave (BAW) resonator 600 in accordance with a representative embodiment. Notably, the BAW resonator 600 is substantively identical to BAW resonator 100, and is provided to show a comparison to the BAW resonator 640 of FIG. 6B. Certain aspects of the BAW resonator 600 are common to the BAW resonators of FIGS. 1A-5. The common aspects and details of the representative embodiment of FIG. 6A to those of the representative embodiments of FIGS. 1A-5 may not be repeated to ensure clarity of the presently described embodiments.

The BAW resonator 600 comprises a lower electrode (not shown in FIG. 6A) disposed over a substrate (not shown in FIG. 6A), and an upper electrode 604 disposed over a piezoelectric layer 603. A passivation layer (not shown in FIG. 6A) may be provided over the upper electrode, as may other components (not shown in FIG. 6A), such as mass loading layers that are useful in improving the performance of the BAW resonator 600.

The BAW resonator 600 comprises an interconnect 612 for providing a signal input or signal output to the upper electrode 604. A bridge (not shown in FIG. 6A) may be optionally provided between the upper electrode 604 and the interconnect 612; and cantilevered portions (not shown in FIG. 6A) may be provided over one or more of the sides of the upper electrode 604, excepting the side of the interconnect 612.

As noted above, the region of contacting overlap of the lower electrode (not shown in FIG. 6A), upper electrode 604, the piezoelectric layer 603 and the cavity (not shown in FIG. 6A) is referred to as an active area of the BAW resonator 600. When an electrical signal is applied to the resonator 600, the acoustic motion of particles is launched and propagated in this area. This acoustic motion contributes to the self-heating of the BAW resonator 600 described below. By contrast, an inactive area of the BAW resonator 600 comprises a region of overlap between lower electrode (not shown in FIG. 6A), or upper electrode 604, or both, and the piezoelectric layer 603 that is not disposed over the cavity.

An opening 617 is provided in the upper electrode 604. The opening 617 is not made in layers beneath the upper electrode (e.g., the piezoelectric layer 603, or the lower electrode (not shown in FIG. 6A). As will be appreciated, the opening 617 comprises a hole in the upper electrode 604, with the bottom of the hole made of the upper electrode 604, and bottom of the hole being the interior bottom surface of the hole made of the piezoelectric layer 603. Without the opening 617 (or the pillar 620 discussed below), the area approximating the opening 617 would observe an unacceptable amount of self-heating as observed in a comparable BAW resonator.

Notably, no electrical connections extend across the opening 617 from one side to another.

A pillar 620 is disposed beneath the opening 617. As will be appreciated, the pillar 620 contacts a portion of the lower electrode disposed beneath the opening 617. In addition to providing mechanical stability to the membrane of the BAW resonator 600, the pillar 620 provides a thermal sink, which beneficially dissipates heat from the region of the plurality of openings 617. Again, a gap 'G' exists as shown. Generally, the pillar 620 has a cross-sectional shape that is the same as the shape of its respective opening 617. In accordance with representative embodiments described herein, the pillar 620 has a cross-sectional area in the range of approximately 3.0 $\mu m^2$ to approximately $1.25 \times 10^5$ $\mu m^2$. The cross-sectional area may be approximately less than 30% of the active area of the BAW resonator 600.

Frame elements, which are shown generally at 618 are optionally provided along the perimeter of the opening 617, and therefore form a portion of the perimeter of the active area of the BAW resonator 600. The use of frame elements is to reduce acoustic energy loss, and therefore improves the quality-factor (Q) of the BAW resonator 600. However, reflections of acoustic waves at the frame elements provided along the perimeter of the opening 617 also reduce the likelihood of energy loss through the pillar 620.

The BAW resonator 600 may optionally comprise a bridge (not shown) along the interconnection side 612. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 600.

The opening 617 is located in a region of the BAW resonator 600 that is otherwise susceptible to unacceptable levels of overheating caused by self-heating as observed in a comparable BAW resonator that is without the opening 617 and/or the pillar 620. This region is often comparatively far from a thermal ground, or anchor point, which is a portion of the inactive area that contacts the substrate. Notably, the shape of the opening 617 is chosen to somewhat match the shape of the region where self-heating can be unacceptably high. Illustratively, the opening 617 has a substantially circular shape, as shown. Again, a gap 'G' is provided, between the edge of the pillar 620 and the opening 617. In accordance with a representative embodiment, the gap 'G' is substantially constant in magnitude.

FIG. 6B is a top view of a bulk acoustic wave (BAW) resonator 640 in accordance with a representative embodiment. Certain aspects of the BAW resonator 640 are common to the BAW resonators of FIGS. 1A-6A. The common aspects and details of the representative embodiment of FIG. 6B to those of the representative embodiments of FIGS. 1A-6A may not be repeated to ensure clarity of the presently described embodiments.

The BAW resonator 640 comprises a lower electrode (not shown in FIG. 6B) disposed over a substrate (not shown in FIG. 6B), and an upper electrode 604 disposed over a piezoelectric layer 603. A passivation layer (not shown in FIG. 6B) may be provided over the upper electrode, and may other components (not shown in FIG. 6B), such as mass loading layers that are useful in improving the performance of the BAW resonator 640.

The BAW resonator 640 comprises an interconnect 612 for providing a signal input or signal output to the upper electrode 604. A bridge (not shown in FIG. 6B) may be optionally provided between the upper electrode 604 and the interconnect 612; and cantilevered portions (not shown in FIG. 6B) may be provided over one or more of the sides of the upper electrode 604, excepting the side of the interconnect 612.

As noted above, the region of contacting overlap of the lower electrode (not shown in FIG. 6B), upper electrode 604, the piezoelectric layer 603 and the cavity (not shown in FIG. 6B) is referred to as an active area of the BAW resonator 640. When an electrical signal is applied to the resonator 640, the acoustic motion of particles is launched and propagated in this area. This acoustic motion contributes to the self-heating of the BAW resonator 640 described below. By contrast, an inactive area of the BAW resonator 640 comprises a region of overlap between lower electrode (not shown in FIG. 6B), or upper electrode 604, or both, and the piezoelectric layer 603 that is not disposed over the cavity.

An opening 617 is provided in the upper electrode 604. Notably, no electrical connections extend across the opening 617 from one side to another.

As discussed above, the opening 617 is not made in layers beneath the upper electrode (e.g., the piezoelectric layer 603, or the lower electrode (not shown in FIG. 6B). As will be appreciated, the opening 617 comprises a hole in the upper electrode 604, with the sides of the hole made of the upper electrode 604, and the interior bottom surface of the hole made of the upper surface of piezoelectric layer 603. Optionally, a passivation layer may be deposited at the place of the hole. Without the opening 617 (or the plurality of pillars 642, 643, 644 and 645 discussed below), the area approximating the opening 617 would observe an unacceptable amount of self-heating as observed in a comparable BAW resonator.

The BAW resonator 640 may optionally comprise a bridge (not shown) along the interconnection side 612. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 640.

A plurality of pillars 642, 643, 644 and 645 are disposed in the cavity (not shown in FIG. 6B). It is noted that the use of a plurality of pillars in a single opening is not limited to the representative embodiment described in connection with FIG. 6B. Rather, disposing a plurality of pillars according to the principles of the presently described representative embodiment, in an opening of representative embodiments described in connection with FIGS. 1A-5B and 7-10, is contemplated by the present teachings.

The shape of each of the plurality of pillars 642, 643, 644 and 645 does not necessarily match the shape of the opening 617. Through careful placement of the plurality of pillars 642, 643, 644 and 645, substantially no electric field is supported in the region of the BAW resonator 640 at the opening. Beneficially, therefore, eliminating the ability for the piezoelectric effect to be supported in the opening 617 eliminates the generation of acoustic waves in the region of the opening 617, and thus eliminates the electric field, and thus the heat source in this region of the BAW resonator 640.

In accordance with a representative embodiment, the plurality of pillars 642, 643, 644 and 645 are selected to have a total area (in cross section) that is the same as the area of the pillar 620 depicted in FIG. 6A. However, the total perimeter of the plurality of pillars 642, 643, 644 and 645 can be shown to be greater that the perimeter of the pillar 620. This increase in the perimeter of the plurality of pillars 642, 643, 644 and 645 may offer an improvement in thermal resistance and potentially, an improvement over the single pillar 620 of the same area in dissipating heat. In accordance with representative embodiments described herein, the plurality of pillars 642, 643, 644 and 645 has a total perimeter in the range of approximately 1.0 µm to approximately 200 µm, and a total cross-sectional area in the range of approximately 3.0 µm$^2$ to approximately 1.25×10$^5$ µm$^2$.

It is noted that a plurality of pillars may be implemented in other BAW resonators of the present teachings. Generally, the plurality of pillars is selected to have a combined cross-sectional area that is substantially the same as the single pillar it replaces, but has a comparatively larger perimeter.

FIG. 6C depicts a cross-sectional view of BAW resonator 640 of FIG. 6B along the line 6C-6C. As can be appreciated, the BAW resonator 640 comprises an FBAR.

The BAW resonator 640 comprises a substrate 601, a cavity 616, a lower electrode 602 disposed beneath a piezoelectric layer 603, and an upper electrode 604 disposed thereover. As shown in FIG. 6C and other embodiments throughout this disclosure, the lower electrode 602 may be disposed over the cavity 616. The cavity 616 may be filled with air or other material that enable the cavity 616 to function as an acoustic reflector reflecting acoustic wave. The piezoelectric layer 603 comprises a first surface in contact with the lower electrode 602 and a second surface in contact with the upper electrode 604. An optional passivation layer 605 is provided over the upper electrode 604. As will become clearer as the present description continues, the substrate 601 comprises a material that is not only amendable to known microfabrication and semiconductor processing methods, but also has a comparatively good thermal conductivity. Generally, the substrate 601 comprises silicon (i.e., polycrystalline or monocrystalline), but other materials, such as gallium arsenide (GaAs) and indium phosphide (InP), are contemplated.

Opening 617 is provided in the upper electrode 604 and the passivation layer 605. Notably, no electrical connections extend across the opening 617 from one side to another.

The opening 617 is not made in layers beneath the upper electrode (e.g., the piezoelectric layer 603, or the lower electrode 602). The opening 617 is provided during fabrication of the upper electrode 604 and passivation layer 605 using known masking methods. As will be appreciated from a review of FIG. 6C, the opening 617 comprises a hole in the upper electrode 604, with the sides of the hole made of the upper electrode 604, and the interior bottom surface of the hole made of the upper surface of piezoelectric layer 603. As noted above, in certain embodiments, the opening 617 is located substantially at the centroid of the BAW resonator 640, and has an areal dimension that approximates the area that would observe an unacceptable amount of self-heating in a comparable BAW as discussed above.

In the cross-sectional view, pillars 642, 644 are shown disposed in the cavity 616, and are aligned within the opening 617 as discussed in the embodiment shown in FIG. 6B. As shown, the pillars 642, 644 contact a portion of the lower electrode 602 disposed beneath the opening 617. The pillars 642, 644 make physical contact with the lower electrode 602, and are not located in the active area of the BAW resonator 640.

Generally, the pillars 642, 644 have a cross-sectional shape that is the same as the shape of the opening 617. In accordance with representative embodiments described herein, the pillars 642, 644 have a cross-sectional area in the range of approximately 3.0 µm$^2$ to approximately 1.25×10$^5$ µm$^2$. The cross-sectional area may be approximately less than 30% of the active area of the BAW resonator 640.

In accordance with a representative embodiment, the pillars 642, 644 comprise the same material as the substrate 601, which is illustratively silicon or other useful material used in the fabrication of BAW resonators. In such an embodiment, the pillars 642, 644 are formed during the fabrication of the cavity 616 through known masking, and dry or wet etching methods that would be readily apparent to one of ordinary skill in the art.

Alternatively, and in accordance with another representative embodiment, rather than silicon, the pillars 642, 644 are made from a high thermal conductivity material. High thermal conductivity materials contemplated include but are not limited to diamond, boron arsenide, boron binary (carbide, nitride), silicon carbide (SiC) Notably, silicon has a thermal conductivity of approximately 150 W/mK. The noted high thermal conductivity materials have a thermal conductivity material in the range of approximately 900 W/mK to approximately 2200 W/mK. Among other benefits, pillars made from a high thermal conductivity material provide a reduced thermal resistance compared to pillars made of silicon and having the same diameters of the pillars 642, 644 (or cross-sectional area if the pillar is not cylindrical).

The region of contacting overlap of the lower and upper electrodes 602, 604, the piezoelectric layer 603 and the cavity 616 is referred to as the active area of the BAW resonator 640. When an electrical signal is applied to the resonator 640, the acoustic motion of particles is launched and propagated in this area. This acoustic motion contributes to the self-heating of the BAW resonator 640 described above. The portion of the inactive area that contacts the substrate 601 and the pillars 642, 644 may be referred to collectively as an anchor point of the BAW resonator 640 (in this case FBAR).

As noted above, the pillars 642, 644 function as an anchor point, or thermal ground, in same way as the anchor point of the substrate 601. To this end, the pillars 642, 644 reduce the overall thermal resistance of the BAW resonator 640 by providing a path to thermal ground, and beneficially contribute to thermal dissipation in the area of the opening 617, which is otherwise susceptible to overheating as observed in a comparable BAW resonator that is without the pillars 642, 644 and/or the opening 617. Beneficially, the pillars 642, 644 provide additional thermal grounding to the active area of the BAW resonator 640 where the heat generated in the active area can dissipate. In other words, the thermal resistance of the BAW resonator 640 is reduced by adding the pillars 642, 644, which reduces the operating temperature for a given dissipated power. Finally, by dissipating heat more effectively, the pillars 642, 644 and the opening 617 of the present teachings augment the power handling threshold for failures related to excessive dissipated power.

The pillars 642, 644 are generally columnar in shape having a cross-section in the x-y plane of the coordinate system shown in FIG. 6C that is one of a variety of shapes, including but not limited to circular, elliptical, hexagonal, or any other irregular shape.

In the representative embodiment depicted in FIG. 6C, a recessed frame element 630 is disposed in the upper electrode 604. Similarly, a raised frame element 632 and a cantilevered portion 634 are provided in the upper electrode 604 and extend along the perimeter of the opening 617, and along the outer perimeter of the BAW resonator 640. The recessed frame element 630, the raised frame element 632 and the cantilevered portion 634 provides an improvement in the Q-factor parallel resonance (Qp) and some improvement in the Q-factor at series resonance (Qs). As alluded to above, the use of recessed frame element 630, raised frame element 632 and cantilevered portion 634, although optional, is particularly beneficial around the perimeter of the opening 617 to foster reflections of acoustic waves along the perimeter of the opening 617 to reduce the likelihood of energy loss through the opening and the pillars 642, 644.

Notably, the areal dimension of the cross-section of the pillars 642, 644 at the point of contact of the pillars 642, 644 with the opening 617 that is less than the cross-sectional area of the opening 617. In some embodiments, the opening 617 has a first cross-sectional area ('first area'), the pillar 642 has a second cross-sectional area ('second area'), and pillar 644 has a third cross-sectional area ('third area'). A sum of the second area and the third area is less than the first area. (It is also noted, as seen in FIG. 6B, that the sum of the cross-sectional areas of the plurality of pillars 642, 643, 644 and 645 is less than the area of opening 617.) As such, and for reasons described more fully below, in accordance with a representative embodiment, a gap 'G' exists between the inner edge of the cantilevered portions 634 and the outer edge of the pillars 642, 644. It is contemplated that in a BAW resonator (not shown) that does not include the cantilevered portion, a gap 'G' exists between an inner edge of the upper electrode 604 and the outer edge of the pillars 642, 644. Generally, but not necessarily, the gap 'G' is substantially constant in magnitude, and as such, the shape of the opening 617 is the same as the shape of the pillars 642, 644.

The lower and upper electrodes 602, 604 each comprise one or two (bi-electrode) electrically conductive materials (e.g., Mo, W, Pt, Ru, Al, Ta, Cu, or Ru) and provide an oscillating electric field in the z-direction of the coordinate system shown (i.e., the direction of the thickness of the substrate 201). In the illustrative embodiment described presently, the z-axis is the axis for the TE (thickness-extensional or "longitudinal") mode(s) for the BAW resonator 640. In a representative embodiment, the piezoelectric layer 603 and lower and upper electrodes 602, 604 are suspended over a cavity 616 that substantially provides acoustic isolation with the substrate 601. Accordingly, the BAW resonator 640 is a mechanical resonator, which can be electrically coupled via the piezoelectric layer 603. Other configurations that foster mechanical resonance by FBARs are contemplated.

The piezoelectric layer 603 comprises a highly textured piezoelectric layer (e.g., AlN), and thus has a well-defined C-axis. As described more fully below, in an apparatus comprising a plurality of BAW resonators 640, the polarization of each BAW resonator impacts the type of the connection (e.g., series connection, anti-series connection) that is made between the BAW resonators 640. As will be appreciated by one of ordinary skill in the art, the growth of piezoelectric material along a C-axis of the material dictates the polarization of the BAW resonator, and thus the type of connection to be implemented. As such, providing a highly-textured piezoelectric layer 603, such as by methods described in the above-referenced U.S. Pat. Nos. 9,243,316 and 8,673,121 to Larson III, et al., is useful in apparatuses comprising BAW resonator 640.

In addition to being highly-textured, the piezoelectric layer 603 of representative embodiments may also comprise one or more rare-earth (e.g., scandium (Sc)) doped layers of piezoelectric material (e.g., aluminum nitride (AlN)) such as described in certain patent applications incorporated by reference above (e.g., U.S. Pat. No. 9,679,765 to John L. Larson III; and U.S. Pat. No. 9,455,681 to Feng, et al.).

Figure 7:
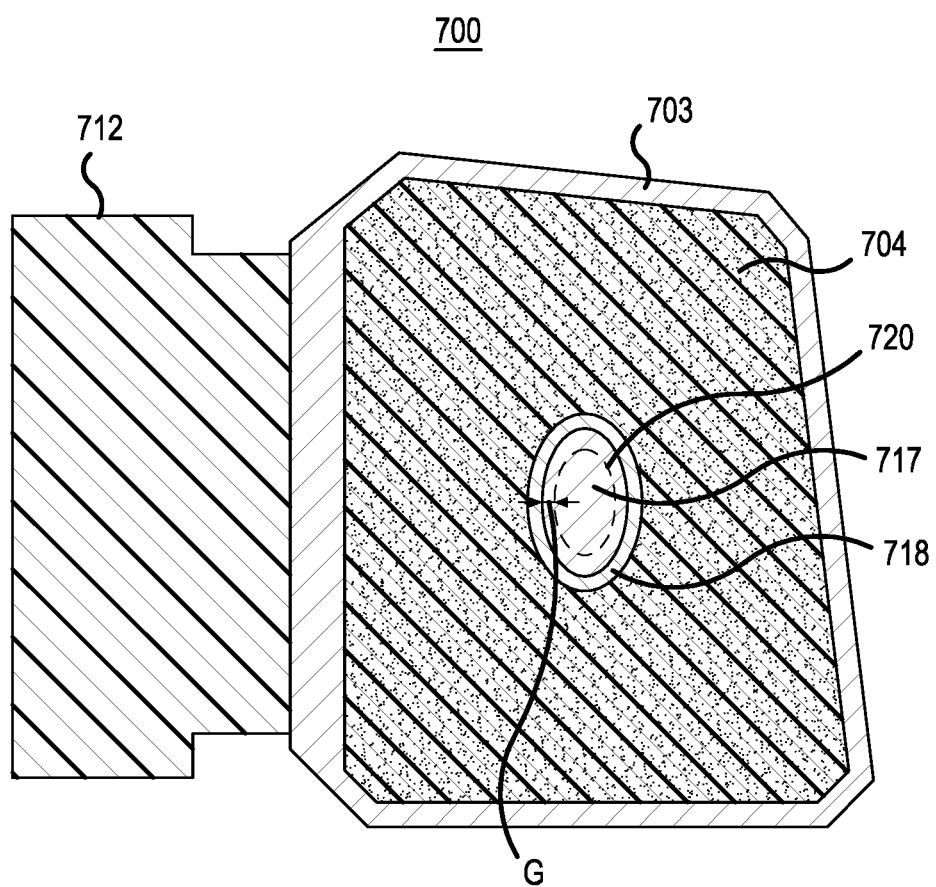
FIG. 7 is a top view of a bulk acoustic wave (BAW) resonator in accordance with a representative embodiment.

FIG. 7 is a top view of a bulk acoustic wave (BAW) resonator 700 in accordance with a representative embodiment. Certain aspects of the BAW resonator 700 are common to the BAW resonators of FIGS. 1A-6C. The common aspects and details of the representative embodiment of FIG.

7 to those of the representative embodiments of FIGS. 1A-6C may not be repeated to ensure clarity of the presently described embodiments.

The BAW resonator 700 comprises a lower electrode (not shown in FIG. 7) disposed over a substrate (not shown in FIG. 7), and an upper electrode 704 disposed over a piezoelectric layer 703. A passivation layer (not shown in FIG. 7) may be provided over the upper electrode, and may other components (not shown in FIG. 7), such as mass loading layers that are useful in improving the performance of the BAW resonator 700.

The BAW resonator 700 comprises an interconnect 712 for providing a signal input or signal output to the upper electrode 704. A bridge (not shown in FIG. 7) may be optionally provided between the upper electrode 704 and the interconnect 712; and cantilevered portions (not shown in FIG. 7) may be provided over one or more of the sides of the upper electrode 704, excepting the side of the interconnect 712.

As noted above, the region of contacting overlap of the lower electrode (not shown in FIG. 7), upper electrode 704, the piezoelectric layer 703 and the cavity (not shown in FIG. 7) is referred to as an active area of the BAW resonator 700. When an electrical signal is applied to the resonator 700, the acoustic motion of particles is launched and propagated in this area. This acoustic motion contributes to the self-heating of the BAW resonator 700 described below. By contrast, an inactive area of the BAW resonator 700 comprises a region of overlap between lower electrode (not shown in FIG. 7), or upper electrode 704, or both, and the piezoelectric layer 703 that is not disposed over the cavity.

An opening 717 is provided in the upper electrode 704. The opening 717 is not made in layers beneath the upper electrode (e.g., the piezoelectric layer 703, or the lower electrode (not shown in FIG. 7). As will be appreciated, the opening 717 comprises a hole in the upper electrode 704, with the bottom of the hole made of the upper electrode 704, and the interior bottom surface of the hole made of the upper surface of piezoelectric layer interior 703. Notably, no electrical connections extend across the opening 717 from one side to another.

Without the opening 717 (or the pillar 720 discussed below), an area approximating the opening 717 would observe an unacceptable amount of self-heating as observed in a comparable BAW resonator.

A pillar 720 is disposed beneath the opening 717. As will be appreciated, the pillar 720 contacts a portion of the lower electrode disposed beneath the opening 717. In addition to providing mechanical stability to the membrane of the BAW resonator 700, the pillar 720 provides a thermal sink, which beneficially dissipates heat from the region of the opening 717. Again, a gap 'G' exists as shown. Generally, the pillar 720 has cross-sectional shape that is the same as the shape of the opening 717. In accordance with representative embodiments described herein, the pillar 720 has a cross-sectional area in the range of approximately 3.0 $\mu m^2$ to approximately $1.25 \times 10^5$ $\mu m^2$. The cross-sectional area may be approximately less than 30% of the active area of the BAW resonator 700.

Of note, in accordance with the present teachings, there are no electrical connections (e.g., bridges) that extend across the opening 717 from one side to another.

Frame elements, which are shown generally at 718 are optionally provided along the perimeter of the opening 717, and therefore form a portion of the perimeter of the active area of the BAW resonator 700. The use of frame elements is to reduce acoustic energy loss, and therefore improves the quality-factor (Q) of the BAW resonator 700. However, reflections of acoustic waves at the frame elements provided along the perimeter of the opening 717 also reduce the likelihood of energy loss through the pillar 720.

The BAW resonator 700 may optionally comprise a bridge (not shown) along the interconnection side 712. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 700.

The opening 717 is located in a region of the BAW resonator 700 that is otherwise susceptible to unacceptable levels of overheating caused by self-heating as observed in a comparable BAW resonator that is without an opening 717 and/or a pillar 720. This region is often comparatively far from a thermal ground, or anchor point, which is a portion of the inactive area that contacts the substrate. Notably, the shape of the opening 717 is chosen to somewhat match the shape of the region where self-heating can be unacceptably high. Illustratively, the opening 717 has a substantially elliptical shape, as shown. Moreover, in the case where one pillar 720 is disposed on the opening 717, the shape of the pillar 720 is generally the same as the shape of the opening. The elliptical shape of the pillar 720 as well as the opening 717 may be advantageous as compared to the circular shape of the same areal dimension shown in FIG. 1A. For example, the elliptical shape has a larger perimeter which offers an improvement in thermal resistance over the circular shape of the same area in dissipating heat. Again, a gap 'G' is provided, between the edge of the pillar 720 and the opening 717. In accordance with a representative embodiment, the gap 'G' is substantially constant in magnitude.

A pillar 720 is disposed in the cavity (not shown in FIG. 7), and is aligned with the opening 717. Through careful placement of the pillar 720, substantially no electric field is supported in the region of the BAW resonator 700 at the opening, and energy cannot be absorbed in the region of the opening 717 and by the pillar 720. Beneficially, therefore, eliminating the ability for the piezoelectric effect to be supported in the opening 717 eliminates the generation of acoustic waves in the region of the opening 717, and thus eliminates the electric field, and thus the heat source in this region of the BAW resonator 700.

Figure 8:
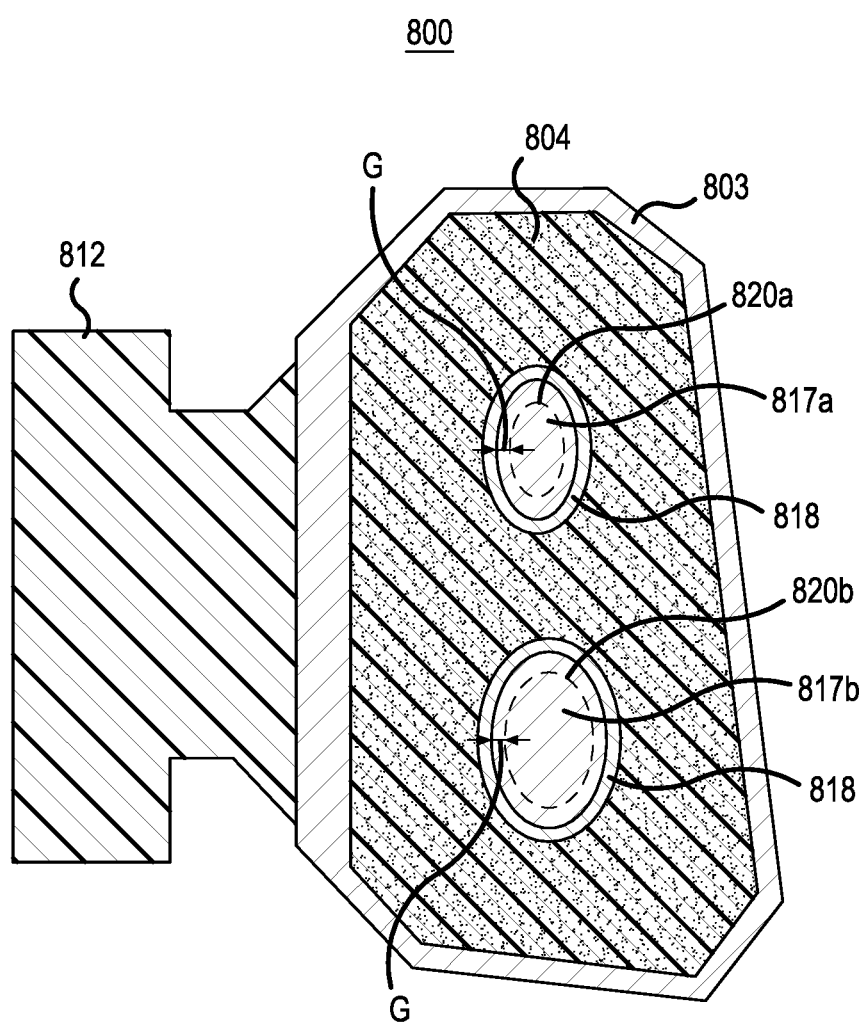
FIG. 8 is a top view of a bulk acoustic wave (BAW) resonator in accordance with a representative embodiment.

FIG. 8 is a top view of a bulk acoustic wave (BAW) resonator 800 in accordance with a representative embodiment. Certain aspects of the BAW resonator 800 are common to the BAW resonators of FIGS. 1A-7. The common aspects and details of the representative embodiment of FIG. 8 to those of the representative embodiments of FIGS. 1A-7 may not be repeated to ensure clarity of the presently described embodiments.

The BAW resonator 800 comprises a lower electrode (not shown in FIG. 8) disposed over a substrate (not shown in FIG. 8), and an upper electrode 804 disposed over a piezoelectric layer 803. A passivation layer (not shown in FIG. 8) may be provided over the upper electrode, as may other components (not shown in FIG. 8), such as mass loading layers that are useful in tuning the frequency.

The BAW resonator 800 comprises an interconnect 812 for providing a signal input or signal output to the upper electrode 804. A bridge (not shown in FIG. 8) may be optionally provided between the upper electrode 804 and the interconnect 812; and cantilevered portions (not shown in FIG. 8) may be provided over one or more of the sides of the upper electrode 804, excepting the side of the interconnect 812. The BAW resonator 800 further comprises a plurality of openings 817a, 817b and a plurality of pillars 820a, 820b. As shown in FIG. 8, the area dimensions of the opening 817a and the pillar 820a are smaller as compared to the area dimensions of the opening 817b and the pillar 820b.

The region of contacting overlap of the lower electrode (not shown in FIG. 8), upper electrode 804, the piezoelectric layer 803 and the cavity (not shown in FIG. 8) is referred to as an active area of the BAW resonator 800. The acoustic motion of particles is launched and propagated in this area. Through loss mechanisms, the acoustic motion contributes to the self-heating of the BAW resonator 800 described below.

The openings 817a, 817b are provided in the upper electrode 804. The openings 817a-817b are not made in layers beneath the upper electrode (e.g., the piezoelectric layer 803, or the lower electrode (not shown in FIG. 8). As will be appreciated, each of the openings 817a, 817b comprises a hole in the upper electrode 804, with the bottom of the hole made of the upper electrode 804, and the interior bottom surface of the hole made of the upper surface of piezoelectric layer 803. Notably, no electrical connections extend across the opening 817a, 817b from one side to another.

The pillars 820a, 820b are disposed beneath the plurality of openings 817a, 817b respectively. As shown, each pillar 820a, 820b contacts a portion of the lower electrode disposed beneath the respective plurality of openings. In addition to providing mechanical stability to the membrane of the BAW resonator 800, the pillar 820a, 820b provides a thermal sink, which beneficially dissipates heat from the region of the plurality of openings 817a, 817b. Again, gap 'G' exists as shown. Generally, the pillars 820a, 820b each has a cross-sectional shape that is the same as the shape of their respective opening 817a, 817b. In accordance with representative embodiments described herein, each pillar 820a, 820b has a cross-sectional area in the range of approximately 3.0 $\mu m^2$ to approximately 1.25×10$^5$ $\mu m^2$. The cross-sectional area may be approximately less than 30% of the active area of the BAW resonator 800.

Of note, in accordance with the present teachings, there are no electrical connections (e.g., bridges) that extend across any of the openings 817a, 817b from one side to another. This is true in embodiments described below, which comprise a plurality of openings 817a, 817b in the BAW resonator 800.

As described more fully below, frame elements, which are shown generally at 818 are optionally provided along the perimeter of the openings 817a, 817b, and therefore form a portion of the perimeter of the active area of the BAW resonator 800. The use of frame elements is to reduce acoustic energy loss, and therefore improves the quality-factor (Q) of the BAW resonator 800. However, reflections of acoustic waves at the frame elements provided along the perimeter of the openings 817a, 817b also reduce the likelihood of energy loss through the pillars 820a, 820b described below.

The BAW resonator 800 may optionally comprise a bridge (not shown) along the interconnection side 812. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 800.

As described below in connection with various representative embodiments, the openings 817a, 817b are located in a region of the BAW resonator 800 that is otherwise susceptible to unacceptable levels of overheating caused by self-heating as observed in a comparable BAW resonator that is without the openings 817a, 817b and/or the pillars 820a, 820b. This region is often comparatively far from a thermal ground, or anchor point, which is a portion of the inactive area that contacts the substrate. Notably, the shape of the openings 817a, 817b are chosen to somewhat match the shape of the region where self-heating can be unacceptably high. For example, as shown in FIG. 8, the area approximating the opening 817a is narrower as compared to the area approximating the opening 817b. For this reason, the opening 817a is selected to be narrower than the opening 817b. Illustratively, the openings 817a, 817b have a substantially elliptical shape, as shown. Again, a gap 'G' is provided, between the edge of the pillars 820a, 820b and the openings 817a, 817b. In accordance with a representative embodiment, the gap 'G' is substantially constant in magnitude.

Pillars 820a, 820b are disposed in the cavity (not shown in FIG. 8), and are aligned with respective openings 817a, 817b. In addition to providing mechanical stability to the membrane of the BAW resonator 800, the pillars 820a, 820b provide a thermal sink, which beneficially dissipates heat from the region of the plurality of openings 817a, 817b. Again, gap 'G' exists as shown. Generally, the pillars 820a, 820b each have a cross-sectional shape that is the same as the shape of their respective opening 817a, 817b. 820a, 820b Through careful placement of the pillars 820a, 820b, substantially no electric field is supported in the region of the BAW resonator 800 at the openings 817a, 817b, and energy cannot be absorbed in the regions of the openings 817a, 817b and by the pillars 820a, 820b. Beneficially, therefore, eliminating the ability for the piezoelectric effect to be supported in each of the plurality of openings 817a, 817b eliminate the generation of acoustic waves in the region of each of the plurality of openings 817a, 817b, and thus eliminates the electric field, and thus the heat source in this region of the BAW resonator 800.

Figure 9:
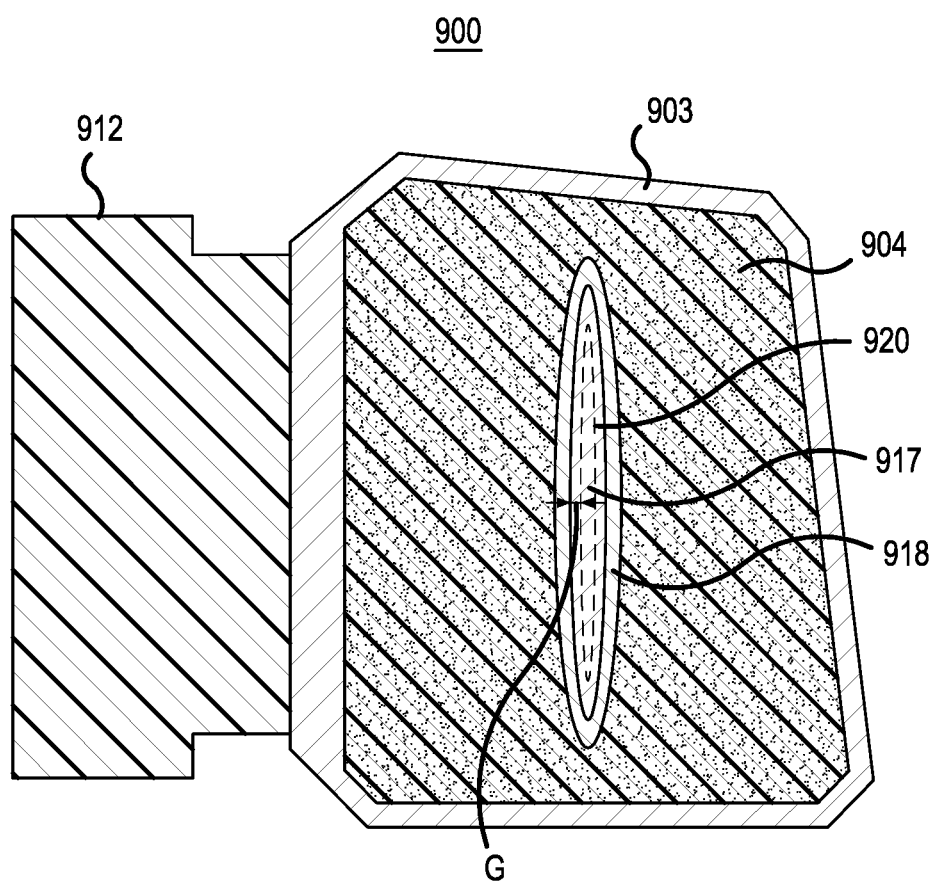
FIG. 9 is a top view of a bulk acoustic wave (BAW) resonator in accordance with a representative embodiment.

FIG. 9 is a top view of a bulk acoustic wave (BAW) resonator 900 in accordance with a representative embodiment. Certain aspects of the BAW resonator 900 are common to the BAW resonators of FIGS. 1A-8. The common aspects and details of the representative embodiment of FIG. 9 to those of the representative embodiments of FIGS. 1A-8 may not be repeated to ensure clarity of the presently described embodiments.

The BAW resonator 900 comprises a lower electrode (not shown in FIG. 9) disposed over a substrate (not shown in FIG. 9), and an upper electrode 904 disposed over a piezoelectric layer 903. A passivation layer (not shown in FIG. 9) may be provided over the upper electrode, as may other components (not shown in FIG. 9), such as mass loading layers that are useful in tuning the frequency of the BAW resonator 900.

The BAW resonator 900 comprises an interconnect 912 for providing a signal input or signal output to the upper electrode 904. A bridge (not shown in FIG. 9) may be optionally provided between the upper electrode 904 and the interconnect 912; and cantilevered portions (not shown in FIG. 9) may be provided over one or more of the sides of the upper electrode 904, excepting the side of the interconnect 912.

As noted above, the region of contacting overlap of the lower electrode (not shown in FIG. 9), upper electrode 904, the piezoelectric layer 903 and the cavity (not shown in FIG. 9) is referred to as an active area of the BAW resonator 900. The acoustic motion of particles is launched and propagated in this area. This acoustic motion contributes to the self-heating of the BAW resonator 900 described below. By contrast, an inactive area of the BAW resonator 900 comprises a region of overlap between lower electrode (not shown in FIG. 9), or upper electrode 904, or both, and the piezoelectric layer 903 that is not disposed over the cavity.

An opening 917 is provided in the upper electrode 904. The opening 917 is not made in layers beneath the upper electrode (e.g., the piezoelectric layer 903, or the lower electrode (not shown in FIG. 9). As will be appreciated, the opening 917 comprises a hole in the upper electrode 904, with the bottom of the hole made of the upper electrode 904, and interior bottom surface of the hole being the upper surface of piezoelectric layer 903. The pillar 920 contacts a portion of the lower electrode disposed beneath the opening 917. Notably, no electrical connections extend across the opening 917 from one side to another.

A pillar 920 is disposed beneath the opening 917. In addition to providing mechanical stability to the membrane of the BAW resonator 900, the pillar 920 provides a thermal sink, which beneficially dissipates heat from the region of the opening 917. Again, a gap 'G' exists as shown. Generally, the pillar 920 has a cross-sectional shape that is the same as the shape of the opening 917. In accordance with representative embodiments described herein, the pillar 920 has a cross-sectional area in the range of approximately 3.0 $\mu m^2$ to approximately $1.25 \times 10^5$ $\mu m^2$. The cross-sectional area may be approximately less than 30% of the active area of the BAW resonator 900.

Of note, in accordance with the present teachings, there are no electrical connections (e.g., bridges) that extend across the opening 917 from one side to another. This is true in embodiments described below, which comprise a plurality of openings 917 in the BAW resonator 900.

Frame elements, which are shown generally at 918 are optionally provided along the perimeter of the opening 917, and therefore form a portion of the perimeter of the active area of the BAW resonator 900. The use of frame elements is to reduce acoustic energy loss, and therefore improves the quality-factor (Q) of the BAW resonator 900. However, reflections of acoustic waves at the frame elements provided along the perimeter of the opening 917 also reduce the likelihood of energy loss through the pillar 920.

The BAW resonator 900 may optionally comprise a bridge (not shown) along the interconnection side 912. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 900.

As will be appreciated from a review of BAW resonator 900 and BAW resonator 700, the eccentricity of the opening 917 is large compared to the eccentricity of the opening 717. The higher eccentricity of the elliptical opening 917 increases the perimeter to the opening area ratio, thus reduces the thermal resistance thus improves the heat dissipation of the BAW resonator 900 compared to BAW resonator 700. Generally, the eccentricity of the elliptical opening 917 is closer to 1.

Figure 10:
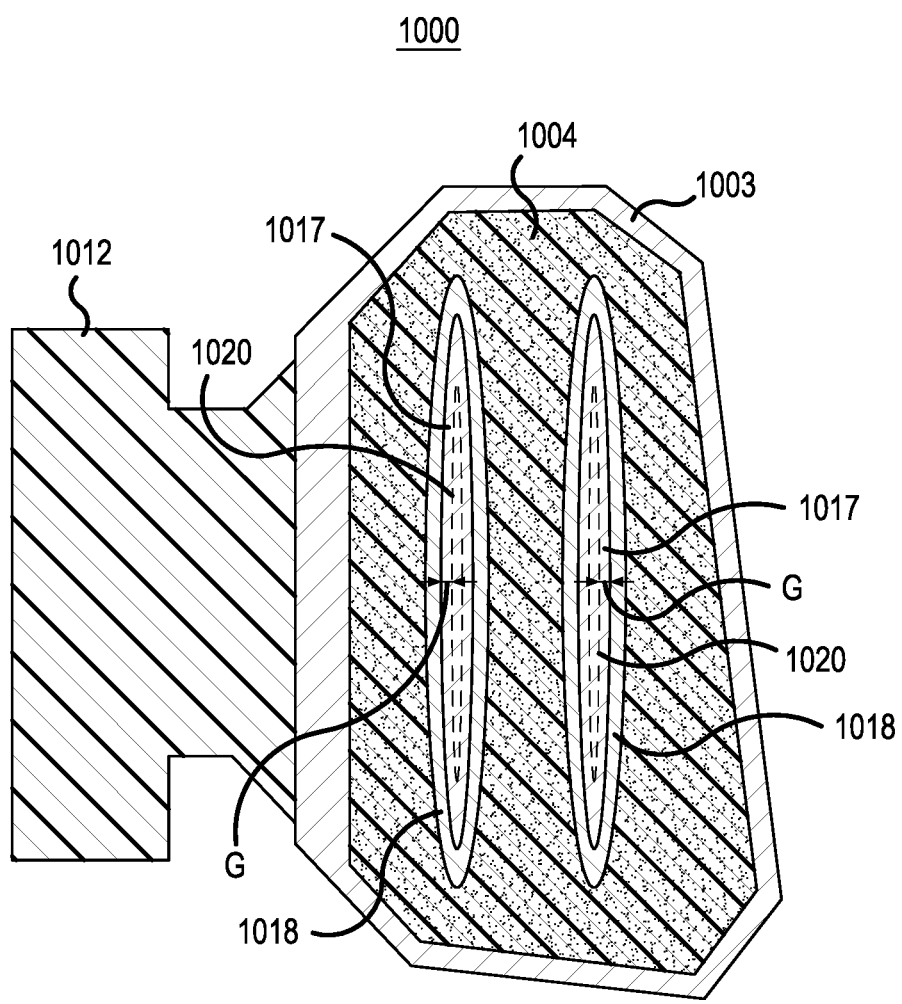
FIG. 10 is a top view of a bulk acoustic wave (BAW) resonator in accordance with a representative embodiment.

FIG. 10 is a top view of a bulk acoustic wave (BAW) resonator 1000 in accordance with a representative embodiment. Certain aspects of the BAW resonator 1000 are common to the BAW resonators of FIGS. 1A-9. The common aspects and details of the representative embodiment of FIG. 10 to those of the representative embodiments of FIGS. 1A-9 may not be repeated to ensure clarity of the presently described embodiments.

The BAW resonator 1000 comprises a lower electrode (not shown in FIG. 10) disposed over a substrate (not shown in FIG. 10), and an upper electrode 1004 disposed over a piezoelectric layer 1003. A passivation layer (not shown in FIG. 10) may be provided over the upper electrode, as may other components (not shown in FIG. 10), such as mass loading layers that are useful in tuning the frequency of the BAW resonator 1000.

The BAW resonator 1000 comprises an interconnect 1012 for providing a signal input or signal output to the upper electrode 1004. A bridge (not shown in FIG. 10) may be optionally provided between the upper electrode 1004 and the interconnect 1012; and cantilevered portions (not shown in FIG. 10) may be provided over one or more of the sides of the upper electrode 1004, excepting the side of the interconnect 1012.

As noted above, the region of contacting overlap of the lower electrode (not shown in FIG. 10), upper electrode 1004, the piezoelectric layer 1003 and the cavity (not shown in FIG. 10) is referred to as an active area of the BAW resonator 1000. The acoustic motion of particles is launched and propagated in this area. This acoustic motion contributes to the self-heating of the BAW resonator 1000 described below. By contrast, an inactive area of the BAW resonator 1000 comprises a region of overlap between lower electrode (not shown in FIG. 10), or upper electrode 1004, or both, and the piezoelectric layer 1003 that is not disposed over the cavity.

Openings 1017 are provided in the upper electrode 1004. The openings 1017 are not made in layers beneath the upper electrode (e.g., the piezoelectric layer 1003, or the lower electrode (not shown in FIG. 10). Notably, no electrical connections extend across any of the openings 1017 from one side to another.

A pillar 1020 is disposed beneath each of the openings 1017. As will be appreciated, a respective pillar 1020 contacts a portion of the lower electrode disposed beneath a respective one of the openings 1017. In addition to providing mechanical stability to the membrane of the BAW resonator 1000, the pillars 1020 provide a thermal sink, which beneficially dissipates heat from the region of the openings 1017. Again, gap 'G' exists as shown. Generally, the pillars 1020 have a cross-sectional shape that is the same as the shape of the openings 1017. In accordance with representative embodiments described herein, each of the pillars 1020 has a cross-sectional area in the range of approximately 3.0 $\mu m^2$ to approximately $1.25 \times 10^5$ $\mu m^2$. The cross-sectional area may be approximately less than 30% of the active area of the BAW resonator 1000.

Of note, in accordance with the present teachings, there are no electrical connections (e.g., bridges) that extend across any of the openings 1017 from one side to another. This is true in embodiments described below, which comprise a plurality of openings 1017 in the BAW resonator 1000.

Frame elements, which are shown generally at 1018 are optionally provided along the perimeter of the openings 1017, and therefore form a portion of the perimeter of the active area of the BAW resonator 1000. The use of frame elements is to reduce acoustic energy loss, and therefore improves the quality-factor (Q) of the BAW resonator 1000. However, reflections of acoustic waves at the frame elements provided along the perimeter of the openings 1017 also reduce the likelihood of energy loss through the pillar 1020.

The BAW resonator 1000 may optionally comprise a bridge (not shown) along the interconnection side 1012. The bridge provides a gap (not shown), which may be a void (e.g., air) or may be filled with a low acoustic impedance material (e.g., non-etchable borosilicate glass (NEBSG), carbon doped silicon dioxide (CDO), or silicon carbide (SiC)). The bridge is described in above-referenced U.S. Pat. No. 8,248,185, and as such many of the details of the bridge are not repeated in the present application to avoid obscuring the description of the representative embodiments of the BAW resonator 1000.

As will be appreciated from a review of BAW resonator 1000 and BAW resonator 700, the eccentricity of the opening 1017 is large compared aspect ratio of BAW resonator 700. The elliptical opening 1017 increases the perimeter to the opening area ratio, and thus reduces the thermal resistance thus improves the heat dissipation of the BAW resonator 1000 compared to BAW resonator 700. Generally, the eccentricity of the elliptical opening 1017 ranges from greater than 0 (zero is the eccentricity of a circle) to less than 1 (1 is the eccentricity of a line).

Figure 11:
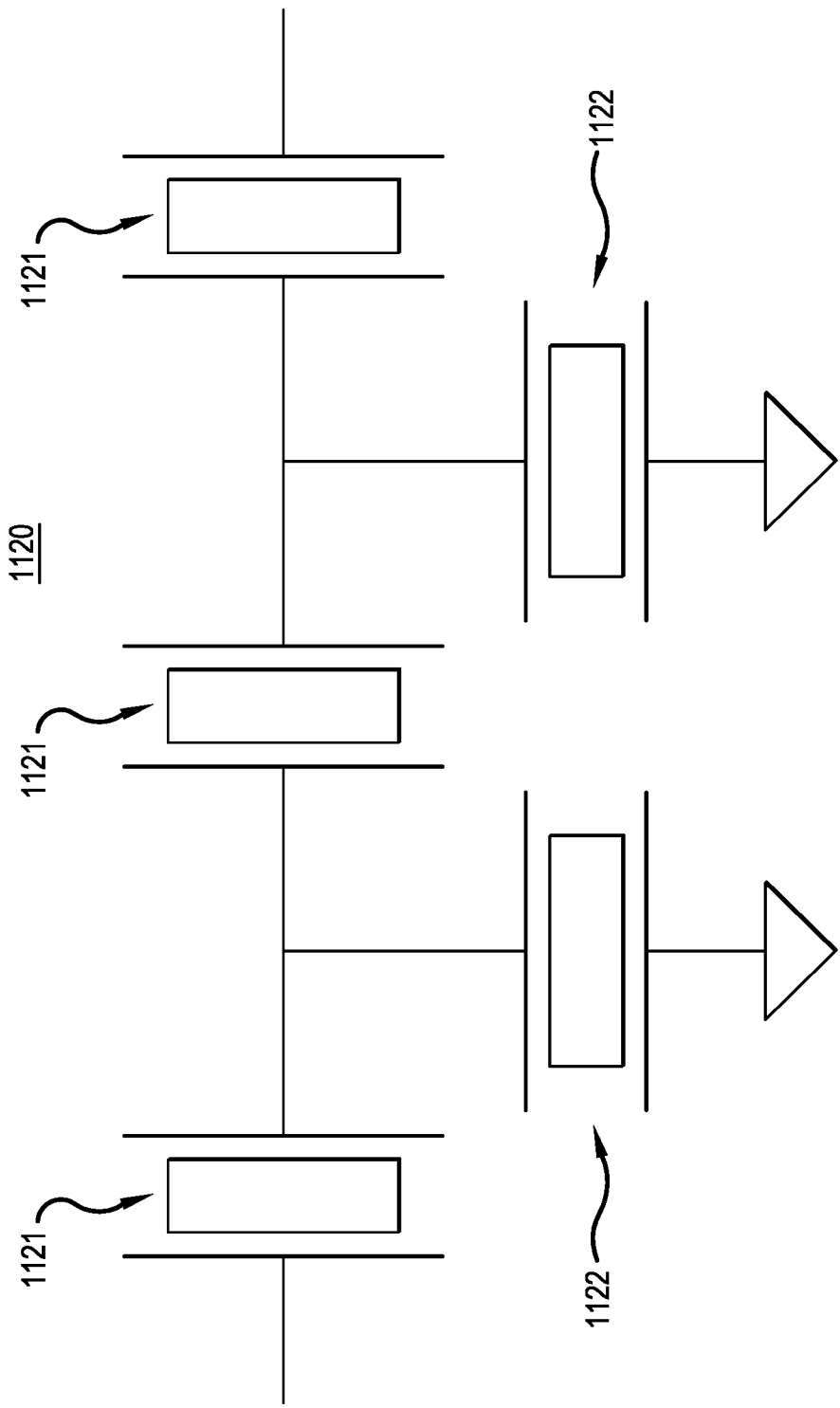
FIG. 11 is a simplified schematic block diagram of an electrical filter in accordance with a representative embodiment.

As alluded to above, and as noted below, the BAW resonators and apparatuses including the BAW resonators of the present teachings are contemplated for use in electrical filter applications, for example. A basic filter design of either a ladder or a lattice topology is constituted of several sections. The number of sections is not limited but selected to trade off performances in terms of insertion loss, roll-off and rejection of the filter. FIG. 11 is a simplified schematic block diagram of an electrical filter 1120 in accordance with a representative embodiment. The electrical filter 1120 comprises series BAW resonators 1121 and shunt BAW resonators 1122. By way of illustration, the series BAW resonators 1121 and shunt BAW resonators 1122 may comprise the acoustic resonators described in connection with the representative embodiments of FIGS. 1A-10. Notably, however, and as can be appreciated by one of ordinary skill in the art, self-heating is more problematic in series resonators than in shunt resonators. As such, in certain embodiments, only series BAW resonators 1121 incorporate the teachings of the representative embodiments of FIGS. 1A-10.

The electrical filter 1120 is commonly referred to as a ladder filter, and may be used for example in duplexer applications. Further details of a ladder-filter arrangement may be as described for example in U.S. Pat. No. 5,910,756 to Ella, and U.S. Pat. No. 6,262,637 to Bradley, et al. The disclosures of these patents are specifically incorporated by reference. It is emphasized that the topology of the electrical filter 1120 is merely illustrative and other topologies are contemplated. Moreover, the acoustic resonators of the representative embodiments are contemplated in a variety of applications besides duplexers.

Figure 12:
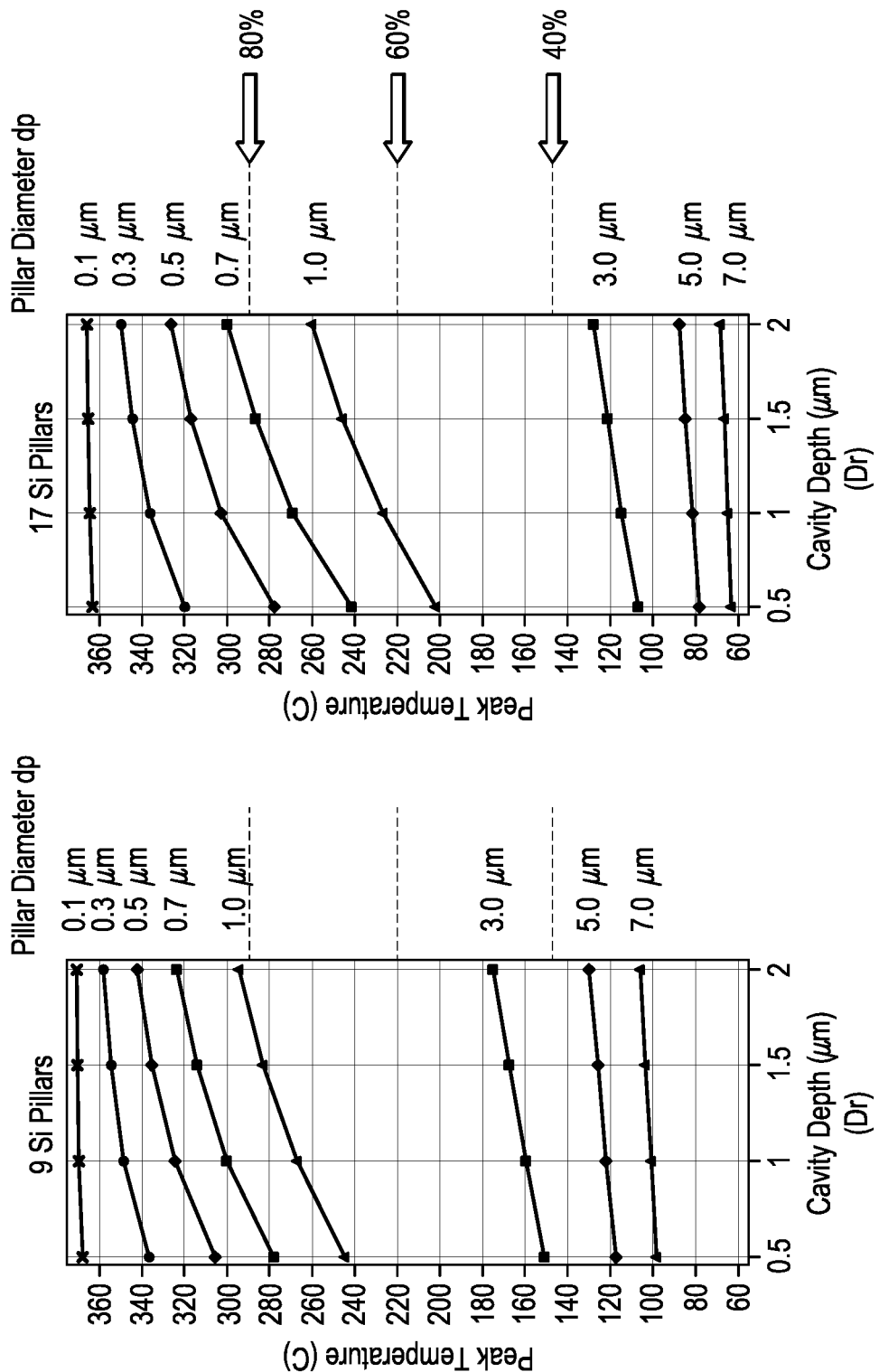
FIG. 12 shows graphs of the peak temperature versus cavity depth for various BAW resonators of different sizes having nine (9) silicon pillars, and 17 silicon pillars.
Figure 13:
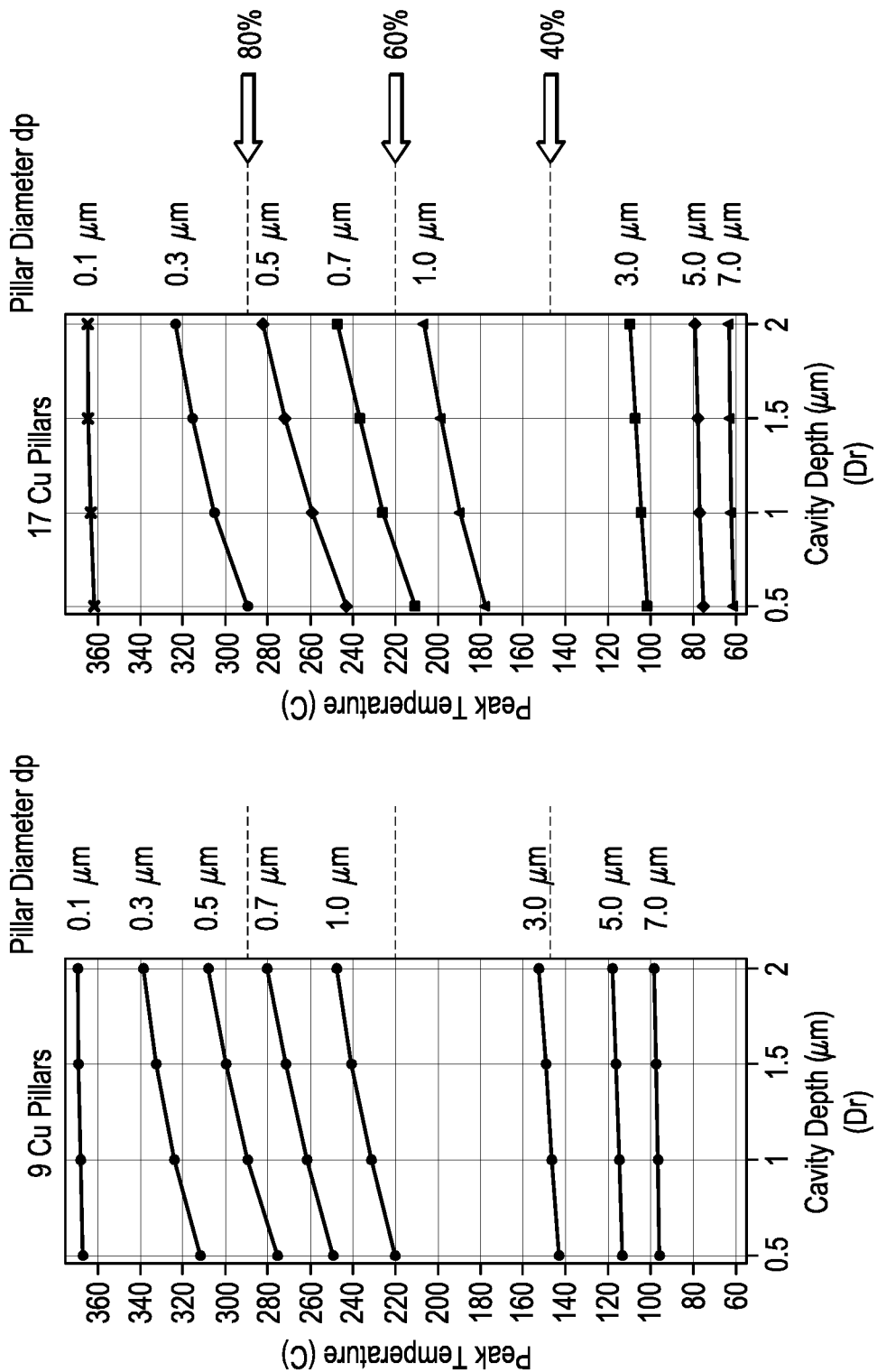
FIG. 13 shows graphs of the peak temperature versus cavity depth for various BAW resonators of different sizes having nine (9) copper pillars, and 17 copper pillars.

As illustrated in the previous embodiments, heat dissipation of the resonator devices are determined by multiple factors such as number of pillars, the pillar material, and the dimension of the BAW resonators 100-1000. Those design parameters are investigated as shown in FIG. 12 and FIG. 13. The investigation results shown in FIG. 12 and FIG. 13 are for heat dissipation considerations only and may not represent actual dimensions of the BAW resonators 100-1000 shown in previous embodiments because other aspect of the pillar designs are not considered.

FIG. 12 shows graphs of the peak temperature versus cavity depth for BAW resonators of different sizes having nine (9) silicon pillars, and seventeen (17) silicon pillars respectively for pillar diameter (dp) ranging from 0.1 µm to 7 µm. In this investigation, cylindrical pillars with a circular cross-sectional view are employed to examine the peak temperature when the pillar diameter varies. A similar comparison can be made for pillars of other shapes such as non-cylindrical shapes. The peak temperature of the BAW resonator shown in the y-axis is plotted against different pillar lengths, or the depth of the cavity (Dr) shown in the x-axis. The depth of the cavity for irregular shaped cavity is defined as the maximum depth measuring in the longitudinal direction of the pillar.

Each graph shows how the peak performance varies when the pillar size is varied. By comparing the two graphs in FIG. 12, the differences of the heat dissipation performance, when the number of silicon pillars, is varied, can be deduced. As shown in FIG. 12, when the pillar diameter (dp) is 0.1 µm or smaller, the peak temperature remains high and close to a situation without any pillar. However, a significant drop of peak temperature is observed when the pillar diameter (dp) is greater than 0.5 µm. In other words, when the pillar diameter is larger than a predetermined size, 0.5 µm in the graphs shown in FIG. 12, the heat dissipation becomes more effective. It is also observed that when the pillar diameter (dp) is larger than 5 µm, the peak temperatures for different cavity depths (Dr) remains substantially flat. One explanation for this observation is that the heat dissipation is approaching a point of diminishing returns, whereby a pillar with a significantly larger diameter and/or a significantly shorter depth gives rise to a smaller reduction in the peak temperature.

Similarly, FIG. 13 shows graphs of the peak temperature versus cavity depth for BAW resonators of different sizes having nine (9) copper pillars, and seventeen (17) copper pillars respectively for pillar diameters ranging from 0.1 µm to 7 µm. The peak temperature shown in the y-axis is plotted against different pillar lengths, or the depth of the cavity (Dr) shown in the x-axis. Each graph shows how the peak performance varies when the pillar size changes. By comparing the two graphs in FIG. 13, the differences of the heat dissipation performance when the numbers of copper pillars is varied can be deduced. By comparing the graphs shown in FIG. 12 and FIG. 13, the effect on peak temperature of using pillar materials with different thermal conductivities (Si vs. Copper in this case) can be understood. Referring to FIG. 12 and FIG. 13, similar observations that the pillar diameter of 0.5 µm and 5 µm can be made.

Based on the results shown in FIG. 12 and FIG. 13, the ratio of the pillar diameter (dp) to the cavity depth (Dr) can be selected to be more than 0.25 (e.g., a pillar diameter (dp) of 0.5 µm and a cavity depth (Dr) of 2.0 µm) to ensure effective heat dissipation. Similarly, to ensure optimal heat dissipation performance, the ratio of the pillar diameter (dp) to the cavity depth (Dr) can be selected to be more than 2.5. The ratio of the pillar diameter (dp) to the cavity depth (Dr) is selected instead of the absolute pillar diameter because in the future, the dimension of the resonator device may shrink further. These ratios may be applicable for various scenarios having different pillar materials and numbers of pillars. For example, as shown in all of the graphs in FIG. 12 and FIG.

13, when the pillar diameter (dp) is more than 5um, the peak temperature (vs. cavity depth) for the pillar is substantially flat, although the material and the number of pillars is different.

The upper limit of the ratio of the pillar diameter (dp) to the cavity depth (Dr) may be dictated by cost considerations. As the pillar diameter is increased, the overall size of the resonator will become bigger to maintain a constant impedance, and therefore, the cost of production will increase. Generally, the ratio of the pillar diameter (dp) to the cavity depth (Dr) is not larger than 40.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

We claim:

1. A bulk acoustic wave (BAW) resonator, comprising:
    a lower electrode;
    a piezoelectric layer disposed over the lower electrode;
    an upper electrode disposed over the piezoelectric layer, wherein an opening having a first area exists in and extends completely through the upper electrode;
    a substrate disposed below the lower electrode;
    a cavity; and
    a pillar disposed in the cavity and extending to contact a portion of the lower electrode located beneath the opening, the pillar having a second area that is less than the first area, wherein there are no electrical connection that extend across the opening from one side to another.

2. The BAW resonator of claim 1, further comprising a frame element disposed over the upper electrode, wherein the frame element is disposed adjacent to a perimeter of the opening.

3. The BAW resonator of claim 2, wherein the frame element is at least one of a raised frame element, a recessed frame element, and a cantilevered portion.

4. The BAW resonator of claim 1, wherein a gap (G) exists between an inner edge of a cantilevered portion and an outer edge of the pillar, or between an inner edge of the upper electrode and the outer edge of the pillar.

5. The BAW resonator of claim 1, wherein the pillar is a first pillar, and the BAW resonator further comprises a second pillar having a third area and disposed in the opening, wherein a sum of the second area and the third area is less than the first area.

6. The BAW resonator of claim 1, wherein the pillar has a circular cross-section.

7. The BAW resonator of claim 1, wherein the pillar has an elliptical cross-section.

8. The BAW resonator of claim 1, wherein the pillar comprises a pillar material having higher heat conductivity than a material of the substrate.

9. The BAW resonator of claim 1, wherein the pillar comprises a pillar material having substantially the same coefficient of thermal expansion (CTE) as the substrate.

10. The BAW resonator of claim 1, wherein the pillar comprises a pillar material that is the same as a material of the substrate.

11. A bulk acoustic wave (BAW) resonator, comprising:
    a lower electrode;
    a piezoelectric layer disposed over the lower electrode;
    an upper electrode disposed over the piezoelectric layer, wherein an opening having a first area exists in and extends completely through the upper electrode;
    a substrate disposed below the lower electrode;
    a cavity; and
    a plurality of openings, and a plurality of pillars, at least one of the plurality of pillars being disposed beneath a corresponding one of the plurality of openings, and contacts a portion of the lower electrode located beneath the opening, wherein no electrical connections that extend across the opening from one side to another.

12. The BAW resonator of claim 11, further comprising a plurality of additional frame elements disposed over the upper electrode, wherein at least one of the plurality of additional frame elements is disposed adjacent to a perimeter of a corresponding one of the plurality of openings.

13. The BAW resonator of claim 11, wherein each of the plurality of pillars has a diameter in a range of approximately 3 μm to approximately 25 μm.

14. The BAW resonator of claim 11, wherein each of the plurality of pillars has an elliptical shape, having an eccentricity greater than zero and less than one.

15. The BAW resonator of claim 11, wherein a gap (G) exists between an inner edge of a respective cantilevered portions and an outer edge of each of the plurality of pillars, or between respective inner edges of the upper electrode and the outer edge of each of the plurality of pillars.

16. The BAW resonator of claim 11, wherein at least one of the plurality of openings has more than one of the plurality of pillars disposed therein.

17. The BAW resonator of claim 11, wherein at least one of the plurality of pillars has an area that is larger or the same cross-sectional area of the other plurality of pillars.

18. The BAW resonator of claim 11, wherein the cavity has a depth (DR) and each of the plurality of pillars has a pillar diameter (dp), and wherein a ratio of Dr to dp is in a range of approximately 0.25 to approximately 40.0.

19. A bulk acoustic wave (BAW) resonator comprising:
    a lower electrode;
    a piezoelectric layer disposed over the lower electrode;
    an upper electrode over the piezoelectric layer, wherein an opening having a first area exists in and extends completely through the upper electrode;
    a substrate disposed below the lower electrode;
    a cavity; and
    wherein the upper electrode comprises a cantilevered portion disposed along a perimeter of the opening forming a space between a portion of a bottom surface of the upper electrode and a top surface of the piezoelectric layer.

20. The BAW resonator of claim 19, further comprising a frame element disposed over the upper electrode, wherein the frame element is disposed adjacent to the perimeter of the opening.

* * * * *